(12) United States Patent
Sera et al.

(10) Patent No.: US 7,595,533 B2
(45) Date of Patent: Sep. 29, 2009

(54) THIN FILM SEMICONDUCTOR DEVICE AND MANUFACTURING METHOD

(75) Inventors: Kenji Sera, Tokyo (JP); Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/740,226

(22) Filed: Apr. 25, 2007

(65) Prior Publication Data

US 2007/0194377 A1 Aug. 23, 2007

Related U.S. Application Data

(62) Division of application No. 10/657,196, filed on Sep. 9, 2003, now Pat. No. 7,224,224.

(30) Foreign Application Priority Data

Sep. 10, 2002 (JP) ............................. 2002-263606
Aug. 4, 2003 (JP) ............................. 2003-285780

(51) Int. Cl.
*H01L 29/76* (2006.01)
*H01L 31/062* (2006.01)

(52) U.S. Cl. ...................... 257/368; 257/347; 257/393; 257/E29.117

(58) Field of Classification Search ................. 257/59, 257/72, 347, 157, 368, 393, E29.117, E29.287, 257/E29.273, E27.112
See application file for complete search history.

(56) References Cited

U.S. PATENT DOCUMENTS

| | | | |
|---|---|---|---|
| 4,446,390 A | 5/1984 | Alaspa | |
| 4,872,010 A | 10/1989 | Larson et al. | |
| 5,162,681 A | 11/1992 | Lee | |
| 5,355,035 A | 10/1994 | Vora et al. | |
| 5,461,713 A | 10/1995 | Pascucci | |
| 5,471,171 A | 11/1995 | Itakura et al. | |
| 5,808,934 A | 9/1998 | Kubo et al. | |

(Continued)

FOREIGN PATENT DOCUMENTS

EP 0 614 226 A1 9/1994

(Continued)

OTHER PUBLICATIONS

K. Kagaku Shuppan, "Basics of MOS Integrated Circuits, No. 5 of VLSI Introduction Series", pp. 62-65 with Partial translation.

*Primary Examiner*—Thanhha Pham
(74) *Attorney, Agent, or Firm*—Sughrue Mion, PLLC

(57) ABSTRACT

When n-channel thin film transistors(TFTs) and p-channel TFTs are formed on a polycrystalline silicon film formed on a glass substrate, a process is included in which P-dopant or N-dopant is introduced at the same time to the channel region of a part of the n-channel TFTs and a part of the p-channel TFTs. In one channel doping operation, a set of low-VT and high-VT p-channel TFTs and a set of low-VT and high-VT n-channel TFTs can be formed. This method is used for forming high-VT TFTs, which can reduce the off-current, in logics and switch circuits and for forming low-VT TFTs, which can enlarge the dynamic range, in analog circuits to improve the performance of a thin film semiconductor.

16 Claims, 20 Drawing Sheets

U.S. PATENT DOCUMENTS

| | | |
|---|---|---|
| 5,889,291 A | 3/1999 | Koyama et al. |
| 6,034,563 A | 3/2000 | Mashiko |
| 6,054,876 A | 4/2000 | Horie et al. |
| 6,190,952 B1 | 2/2001 | Xiang et al. |
| 6,191,435 B1 | 2/2001 | Inoue |
| 6,215,159 B1 | 4/2001 | Fujita et al. |
| 6,246,221 B1 | 6/2001 | Xi |
| 6,306,709 B1 | 10/2001 | Miyagi et al. |
| 6,353,244 B1 | 3/2002 | Yamazaki et al. |
| 6,515,336 B1 * | 2/2003 | Suzawa et al. ............. 257/350 |
| 6,544,146 B1 | 4/2003 | Stearns et al. |
| 6,567,327 B2 | 5/2003 | Tsuchi |
| 6,614,295 B2 | 9/2003 | Tsuchi |
| 6,774,574 B1 * | 8/2004 | Koyama ................. 315/169.3 |
| 2001/0035774 A1 | 11/2001 | Kotani |
| 2002/0021606 A1 | 2/2002 | Tsuchi |
| 2002/0088971 A1 | 7/2002 | Tezuka et al. |
| 2002/0096723 A1 | 7/2002 | Awaka |
| 2002/0098635 A1 | 7/2002 | Zhang et al. |
| 2003/0038655 A1 * | 2/2003 | Minamizaki et al. .......... 327/66 |

FOREIGN PATENT DOCUMENTS

| | | |
|---|---|---|
| EP | 0 690 510 A1 | 1/1996 |
| EP | 0 809 362 A2 | 11/1997 |
| EP | 1 091 491 A1 | 4/2001 |
| EP | 1 217 662 A1 | 6/2002 |
| JP | 61-100010 A | 5/1986 |
| JP | 7-29381 A | 1/1995 |
| JP | 8-264798 A | 10/1996 |

* cited by examiner (1) LOW-VT P-TYPE TFT  (2) HIGH-VT P-TYPE TFT  (3) LOW-VT N-TYPE TFT  (4) HIGH-VT N-TYPE TFT

THIN FILM SEMICONDUCTOR DEVICE AND MANUFACTURING METHOD

FIELD OF THE INVENTION

The present invention relates to a thin film semiconductor device and a method of manufacturing the thin film semiconductor device, and more particularly to a thin film semiconductor device, which includes at least an analog circuit part and a switch using thin film transistors (TFT: an abbreviation of a thin film transistor) having different threshold voltages (a threshold voltage is also designated as VT in the below), and a manufacturing method thereof.

BACKGROUND OF THE INVENTION

A display device, such as a liquid crystal display device and an organic EL (electroluminescence) display device that are thinner and lighter than a CRT, has been used as the monitor of a portable terminal such as a cellular phone and a mobile device or as the monitor of a notebook personal computer. An image is displayed on a liquid crystal display device or an organic EL display device by forming a display part, which has pixels arranged in a matrix, on an insulating substrate such as a glass substrate using the thin film formation technology and by sending signals, corresponding to video data, to the pixels via the driver circuits such as an externally installed gate driver and a data driver to control the orientation of liquid crystals or the luminescence of organic EL devices. A recent development in the thin film formation technology makes it possible to form polycrystalline silicon TFTs on the same substrate as that of the display part and therefore to form a part of the driver circuit with polycrystalline silicon TFT circuits.

Compactness, low power dissipation, and high performance are important for a portable terminal and, to satisfy those needs, there is a need for a compact, low-power-dissipation type display device. To make a display device compact, the display part and the driver circuit are integrated into a glass substrate to reduce the number of external parts and to make the device compact. The integration of the display part and the driver circuit reduces the load capacity that would be caused by a connection resistance or a wiring(interconnection) to external connection terminals required in case of the driver circuits mounted external to the display part and, at the same time, reduces power dissipation. Recently, a display device is required to display a high definition, clear image, with increasing demand for an active matrix display device that forms each pixel independently. An active matrix display device has switching devices, at least one for each pixel. When a switching element is turned on by the signal corresponding to an image supplied from the driver circuit and the signal controlling a switching element, the signal corresponding to an image is sent to each pixel for display. When an active matrix display part and the driver circuit are integrated, for example, on a glass substrate, the switching elements (TFTs) of the pixels and the TFTs of the driver circuits formed on the same substrate are fabricated at the same time.

The TFTs described above include two types of TFT, n-channel type and p-channel type. Because a polycrystalline silicon film, which is an active layer, usually tends to be of n-type, an n-channel TFT is slightly of depression type, as a result of which, driving power is relatively increased and off current is increased. For a display device, especially, a display device used for a mobile communication terminal, a low off current is required at least in a switch TFT to reduce power dissipation. Therefore, doping is performed in the channel region of an n-channel TFT during TFT fabrication process to control a threshold voltage VT.

Because channel doping is usually performed for the channel regions of a plurality of TFTs at a time, the dose of dopant implanted into the plurality of TFTs is almost equal among them. It is also possible to change the dose according to TFTs during a single doping operation. A reference is made to a publication such as Japanese Patent Kokai Publication JP-A-8-264798.

Japanese Patent Kokai Publication JP-A-8-264798 (pages 4-7, FIG. 5) discloses a method of varying the thickness of a control film (silicon dioxide film), provided for controlling the dopant implantation amount, and then performing doping from above the control film according to the region with a large dosage in the thin control film part and a small dosage in the thick control film part.

SUMMARY OF THE DISCLOSURE

There are many types of circuits that are built using TFTs; some circuits such as a logic circuit perform digital processing using a signal of binary levels, low and high, while other circuits such as an amplifier circuit perform analog processing to process continuous amounts. A switch is a device that switches the conducting state, conducting and non-conducting, between two terminals to cut off the current between two terminals or, when combined with a capacitor, to store electric charge. A switch is built in a logic circuit or an analog circuit according to the purpose.

However, the performance of a TFT required in those circuits depends on the circuit. For example, a TFT used in a logic circuit or a switch is required to have the sufficient current drive capability when it is on and is required to cut off the current when it is off. In particular, when low power dissipation is very important, the off-leakage current must be sufficiently low. In this case, the threshold voltage is set higher. On the other hand, when a TFT used in an analog circuit, a TFT in a circuit where an idling current is flowing is always on. It is important for the operation of an analog circuit to control drain current precisely, from small to large current value, with control voltage supplied to a gate of the TFT.

An off-leakage current, if large, power dissipation is increased because a leakage current flows even when the circuit is inactive. This is a serious problem especially for driver circuits in a mobile device where the battery life is one of important performance factors. In addition, a recent demand for low energy requires even non-mobile devices to reduce power dissipation during operation time and to reduce standby power dissipation during standby time. To meet those demands, the threshold voltage VT of a TFT used in a conventional circuit is set higher so that the off-leakage current becomes sufficiently low (for example, 1 pA or less).

However, channel doping is conventionally performed for the channel region of all n-channel (or p-channel) TFTs at a time. For example, when channel doping is performed for n-channel TFTs, the VT of all n-channel TFTs is controlled in the same way. Therefore, when the threshold voltage of TFTs is set higher to reduce the off-leakage current, the active range in which a TFT is set in an on state in the power supply voltage range becomes narrower and the upper limit of the TFT current driving power is decreased. This generates other problems such as a reduced operation speed of a circuit or a narrower dynamic range (output voltage range against to power voltage range) of an analog circuit.

When doping is performed for one of n-channel TFTs and p-channel TFTs, the change amount of the drain current with respect to the gate-to-source voltage changes only in the TFTs of one of channel types and therefore the VT becomes unsymmetrical between n-channel TFTs and p-channel TFTs. For example, when building a CMOS circuit, a TFT with a lower operation speed is employed with the result that the circuit characteristics are not good.

To keep the symmetry in the VTs, a method is employed to perform channel doping for n-channel TFTs and p-channel TFTs separately. However, even in this method, the problem remains unresolved because the same VT is used for the TFTs of the same channel type; that is, a higher VT degrades the operation speed and the dynamic range of an analog circuit, while a lower VT increases the off current of a logic circuit or a switch circuit. More strictly speaking, a fabrication error such as a doping precision error prevents VT symmetry from being maintained and this error, in turn, prevents thin film semiconductor devices with a well-balanced VT from being fabricated. Another problem is that the process becomes complicated because channel doping is performed multiple times separately. If this channel doping is performed according to the method disclosed in Japanese Patent Kokai Publication JP-A-8-264798, the channel-doping operation must be performed at least once for each of n-channel TFTs and p-channel TFTs. This does not solve the problem that the process becomes complicated.

This problem applies not only to circuits used in a display device such as a liquid crystal display device and an organic EL display device but also to circuits in general comprising n-channel TFTs and p-channel TFTs in which a polycrystalline silicon film is used as an active layer.

Accordingly, it is an object of the present invention to provide a thin film semiconductor device and its manufacturing method for forming n-channel TFTs and p-channel TFTs, both of which have a VT suitable for each circuit, without making manufacturing process complicated and for increasing the performance of an analog circuit without increasing power dissipation.

The above and other objects are attained by a thin film semiconductor device in accordance with one aspect of the present invention which comprises at least n-channel thin film transistors (TFT) and p-channel TFTs on an insulating substrate with a polycrystalline silicon film as an active layer, wherein said thin film transistors of an identical channel type include plural classes of thin film transistors whose threshold voltages are different one another; and that said thin film transistors of different channel types include thin film transistors to which the same dopant are introduced into channel regions thereof at approximately with approximately an equal dose.

In accordance with the present invention, the plurality types of TFTs with different threshold voltages comprise either a TFT including P-type or N-type dopant in the channel region and a TFT not including dopant in the channel region or a TFT including P-type or N-type dopant in the channel region and a TFT including both P-type and N-type dopants in the channel region.

In accordance with the present invention, a circuit constituting the thin film semiconductor device comprises at least an analog circuit requiring an idling current at circuit operation time and a switch, wherein the analog circuit preferably includes a low threshold voltage TFT, which is included in the plurality types of TFTs with different threshold voltages, on a current path of the idling current and wherein the switch is preferably composed of a high threshold voltage TFT which is included in the plurality of types of TFTs with different threshold voltages.

In accordance with the present invention, the analog circuit preferably includes at least a switch on the current path of the idling current for cutting off the idling current and wherein the activation and deactivation of the analog circuit is preferably controlled by the conduction and cutoff of the idling current via the switch.

In accordance with the present invention, when the low threshold voltage TFT is included in a current path route of the idling current among an input terminal, an output terminal, and power supply terminals, the analog circuit part includes the switch in the current path route.

In accordance with the present invention, the analog circuit part may be a differential amplifier circuit that at least includes the low threshold voltage TFTs in a differential pair and includes the switch in a current path route of the differential pair.

A display device according to the present invention has a display unit and a circuit part driving the display unit integrated on an insulating substrate wherein the circuit part includes the analog circuit and the switch.

A display device according to the present invention comprises a circuit part, which comprises an analog circuit part, a logic circuit part, and switches formed on a polycrystalline silicon film on an insulating substrate using TFTs, and a display unit, wherein the analog circuit part includes TFTs whose threshold voltage is lower than the threshold voltage of TFTs used in the logic circuit part.

In accordance with the present invention, the analog circuit part receives power via the switches and either the switches are each composed of a TFT whose threshold voltage is equal to that of a TFT used in the logic circuit part or pixel switches of the display unit are each composed of a TFT whose threshold voltage is equal to that of a TFT used in the logic circuit part.

A method of manufacturing a thin film semiconductor device, in accordance with another aspect of the present invention, forming at least n-channel TFTs and p-channel TFTs using a polycrystalline silicon film on an insulating substrate comprises the step of introducing P-type dopant or N-type dopant into the channel region of at least a part of the n-channel TFTs and at least a part of the p-channel TFTs at the same time.

A method according to the present invention is a method of forming at least n-channel TFTs and p-channel TFTs using a polycrystalline silicon film on an insulating substrate comprising the steps of introducing P-type or N-type dopant onto the overall region; and introducing the N-type dopant or the P-type dopant into the channel region of at least a part of the n-channel TFTs and at least a part of the p-channel TFTs at the same time.

The thin film semiconductor device according to the present invention has the configuration described above in which, on a polycrystalline silicon film formed on an insulating substrate such as a glass, high-VT TFTs are formed so that the off current of a logic circuit or a switch is reduced, and low-VT TFTs are formed so that the operation speed and the dynamic range of an analog circuit are increased, without making the fabrication process complicated. Because the same dopant at an approximately equal density is added to n-channel TFTs and p-channel TFTs for which channel doping is performed, VT symmetry can be maintained and therefore TFTs suitable for each circuit can be built.

The thin film semiconductor device, according to another aspect of the present invention, comprises an insulating substrate and an n-channel TFT and a p-channel TFT each having a crystalline silicon film as an active layer on the insulating substrate, wherein p-channel type TFT and/or n-channel type TFT includes plural classes of TFT, threshold voltage of TFTs belonging to different classes being different one another; and there are provided at least pair of TFTs, each channel type being different and each having the same dopant introduced into a channel region with substantially the same dose.

In the present invention, there are two types of TFTs, one TFT having a channel region implanted with dopant and another TFT having a channel region not implanted with dopant.

In accordance with another aspect of the present invention, a thin film semiconductor device may comprises a plurality of TFTs of an n-channel type and a p-channel type, each having a crystalline silicon film as an active layer on the insulating substrate; a plurality of TFTs of an n-channel type and/or a p-channel type being classified into a plurality of classes having different threshold voltage; wherein thin film semiconductor device includes at least one TFT having a relatively low threshold voltage and at least one TFT having a relatively high threshold voltage inserted in series in a current path between terminals of power supplies and/or between terminal of the power supply and an input/output terminal; said TFT having a relatively high threshold voltage and being controlled to be turned on and off by a control signal supplied to a control terminal thereof, controls activation and inactivation of said TFT having a relatively low threshold value.

The thin film semiconductor device and its manufacturing method according to the present invention achieve advantageous effects described below.

The effect of the present invention is that TFTs each with a different VT may be formed for each of n-channel TFTs and p-channel TFTs without increasing the number of processes.

The reason is that, channel doping is performed not for one of n-channel TFTs and p-channel TFTs but for all or a part of n-channel TFTs and all or a part of p-channel TFTs at the time. This enables the doping operation to be performed for n-channel TFTs and p-channel TFTs at the same time and, in addition, the VT to be varied among TFTs of the same channel type according to whether or not doping is performed.

Another effect of the present invention is that VT symmetry between n-channel TFTs and p-channel TFTs is maintained and therefore the circuit can be designed optimally.

The reason is that doping is performed for n-channel TFTs and p-channel TFTs not separately but in the same process using the same dopant at an equal density. This maintains VT symmetry.

The further effect of the present invention is that a circuit including logics or switches that have good off-characteristics and analog circuits that have high operation speeds and wide dynamic rages may be formed easily.

The reason is that regions to be channel-doped are selectively set up for TFTs requiring good off-characteristics such as logics and switches and TFTs for analog circuits not requiring good off-characteristics and that N-type or P-type dopant is introduced according to the characteristics required for each circuit to control the VT.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
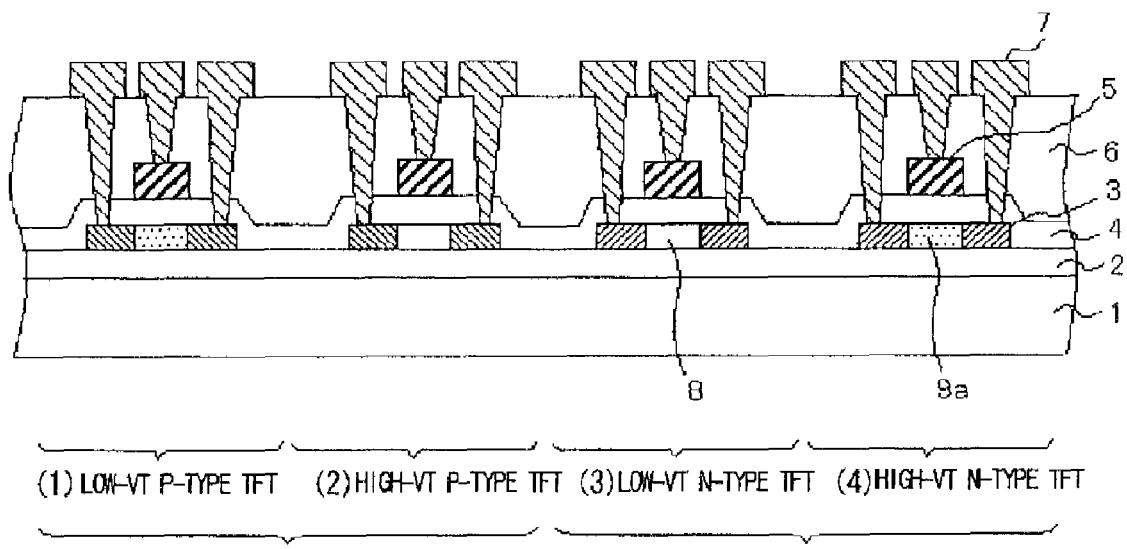
FIG. 1 is a cross section diagram showing the configuration of a thin film semiconductor according to one embodiment of the present invention.

Preferred embodiments of a thin film semiconductor device and its manufacturing method according to the present invention will be described below with reference to the drawings. In the description of the embodiment below, an analog circuit means a circuit that processes a continuous amount and requires an idling current at an operation point during stable operation. A logic circuit means a circuit that processes a two-level voltage, that is, high level and low level. A switch means a device that switches the conducting state, conducting and non-conducting, between two points.

On a thin film semiconductor device on which n-channel TFTs and p-channel TFTs composed of a polycrystalline silicon film are formed, channel doping is performed for n-channel TFTs (or p-channel TFTs) to reduce the off-current of the TFTs as described in the description of the related art. This method allows TFTs of the same channel type to have an equal VT. A problem is that, when the VT is set higher to sufficiently reduce the TFT off-leakage current for low power dissipation, the operation speed and the dynamic range of an analog circuit are degraded and, in addition, good circuit characteristics cannot be obtained because of the loss of symmetry in the VT.

On the other hand, when a circuit is formed on a silicon substrate (called a silicon circuit), a sense amplifier of a memory circuit, for example, uses two types of VTs to provide a quick response and to suppress a leakage current, with the well potential adjusted for each circuit for controlling the VT. However, although the well potential control method can be used for a silicon circuit that has a back gate, the technology for silicon circuits cannot be used for TFTs that are provided on an insulating substrate.

To control the VT of TFT in a logic circuit and a switch and the VT of TFT in an analog circuit separately on a thin film semiconductor formed on an insulating substrate, the VT can be controlled individually by performing channel doping separately also for TFTs of the same channel type.

However, this method requires channel doping at least once for each of n-channel TFTs and p-channel TFTs, complicating the fabrication process of a thin film semiconductor device. An increase in cost due to an increase in the number of processes is a serious problem especially to a device such as a cellular phone where price reduction is important.

Although it is possible to allow TFTs of the same channel type to have different VTs according to the method disclosed in Japanese Patent Kokai Publication JP-A-8-264798, the method disclosed in the publication is not intended to perform doping for both n-channel TFTs and p-channel TFTs at the same time. Instead, the method is provided to give a lower VT to a TFT that is far from the gate line driver circuit considering a decrease in the voltage due to the wiring resistance of the gate line of an active matrix display device. Therefore, as with the method for individual channel doping, this method also requires channel doping at least once for each of n-channel TFTs and p-channel TFTs.

The methods described above, which perform channel doping separately for n-channel TFTs and p-channel TFTs, destroy the symmetry of the VT of each channel type. Thus, the methods do not solve the problem that the desired circuit characteristics cannot be obtained when forming CMOS circuits and so on.

The inventors of the present invention have found that, during analog circuit operation, the off-current characteristics of TFTs are not so important in controlling the VT of each circuit. That is, except an analog circuit such as an analog switch for cutting off current, a TFT is in an on-state because an idling current usually flows through the analog circuit during operation and therefore the amount of the leakage current in an off-state does not affect the operation performance and the power dissipation of the analog circuit. On the other hand, a lower VT of a TFT increases the operation speed, and enlarges the dynamic range, of an analog circuit. Therefore, the amount of off current of a TFT, if somewhat larger during the operation of an analog circuit, does not cause a problem and the performance is increased as the VT becomes lower.

With those characteristics of an analog circuit in mind, the inventors have invented a method for introducing the same dopant to some parts of n-channel TFTs and some parts of p-channel TFTs at the same time to control the VT so that it is suitable for n-channel TFTs and p-channel TFTs without complicating the doping process. There has been a method of introducing different dopants to n-channel TFTs and p-channel TFTs to control the VT. A method of introducing the same dopant to TFTs of different channel types to control the VT is a new method invented by the inventor of the present invention.

The structure and the manufacturing method of a thin film semiconductor according to one embodiment of the present invention will be described below with reference to FIGS. 1-6. FIGS. 1-6 show n-channel TFTs and p-channel TFTs (a total of four TFTs), each having a different VT, formed on an insulating substrate. The present invention is not limited to the configuration shown in the drawings. Instead, the present invention may be applied to a configuration in which n-channel TFTs and p-channel TFTs are mixed and there is a plurality of TFTs of at lest one of channel types.

As shown in FIG. 1, on a polycrystalline silicon film 3 formed on an insulating substrate 1 made of glass, plastic, and so on via an undercoat layer 2, a thin film semiconductor device in accordance with one embodiment of the present invention has a low-VT p-channel TFT (hereinafter called a low-VT p-type TFT (1)) and a high-VT n-channel TFT (hereinafter called a high-VT n-type TFT (4)) that have a channel region to which B (boron) is added at an approximately equal dose and an undoped high-VT p-channel TFT (hereinafter called a high-VT p-type TFT (2)) and a low-VT n-channel TFT (hereinafter called a low-VT n-type TFT (3)). That is, the thin film semiconductor device is characterized in that TFTs with different VTs may be formed not only for TFTs of different channel types but also for TFTs of the same channel type. In the above description, a high VT or a low VT indicates the relation of the absolute values of the potential. The manufacturing method of a thin film semiconductor device with this configuration will be described with reference to the process cross-sectional diagrams in FIGS. 2a to 2e and FIGS. 3a to 3c.

Figure 2A:
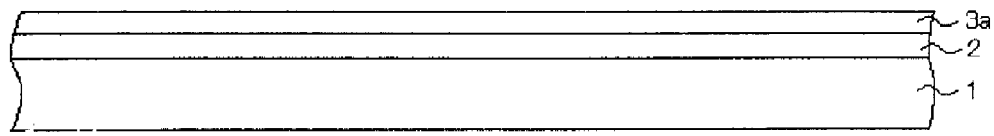
FIGS. 2a to 2e are process cross section diagrams illustrating the manufacturing method (B doping) of the thin film semiconductor device according to one embodiment of the present invention.

First, as shown in FIG. 2a, a silicon oxide film (SiOx) or a silicon nitride film (SiNx), about 300 nm in thickness, is formed as the undercoat layer 2 on the insulating substrate 1, made of glass or plastic, using the LPCVD (low-pressure chemical vapor deposition) method, the PCVD (plasma activated chemical vapor deposition) method, or the spattering method. The undercoat layer 2, provided to prevent impurities from being diffused from the insulating substrate 1 into the active layer, need not be provided when the effect of impurities is not a problem. After that, an amorphous silicon (hereinafter abbreviated a-Si) film 3a, which is an active layer 20 nm-100 nm in thickness, is formed using the LPCVD method, the PCVD method, or the spattering method. When the PCVD method is used, dehydrogenation processing is performed after the film is formed.

Figure 2B:
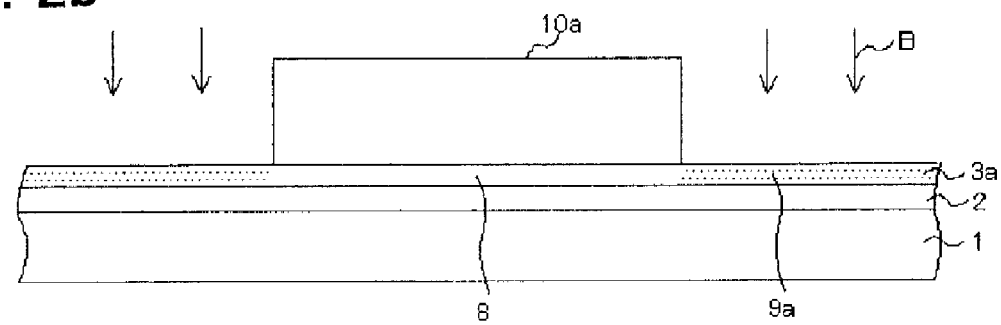

Next, as shown in FIG. 2b, a resist pattern 10a is formed on the a-Si film 3a, with openings provided in regions for doping, using the photolithography process, and then channel doping is performed using the ion implantation method or the ion doping method. According to the conventional method for fabricating a thin-film semiconductor device, doping is performed for all TFTs of the same channel type (for example, two n-channel TFTs in the right side in FIG. 2a). By contrast, according to the present invention, B (boron) is selectively doped into at least a part of n-channel TFTs (n-channel TFTs in the right part in the drawing) and at least a part of p-channel TFTs (p-channel TFTs in the left side in the drawing) to control the VT of both n-channel TFTs and p-channel TFTs in one doping operation. The dose of impurity used by the ion implantation method or the ion doping method depends on the VT to be set. Usually, implantation/doping is preferably executed with the dose of the range from $2E+11/cm^2$ to $5E+12/cm^2$.

Because four types of TFTs are formed at the same time in the above description, a TFT for which B doping is performed and a TFT for which B doping is not performed are provided for each of n-channel TFTs and p-channel TFTs. When it is desired to form only one of n-channel TFTs and p-channel TFTs whose VT varies among them, B doping should be performed partially only for the TFTs of that channel type. Although TFTs with different VTs are classified into two types of TFTs, that is, high VT TFTs and low VT TFTs, in this embodiment, VTs may be classified into three or more. In that case, doping processes, each with a different dopant or a different dosage, should be added.

Figure 2C:
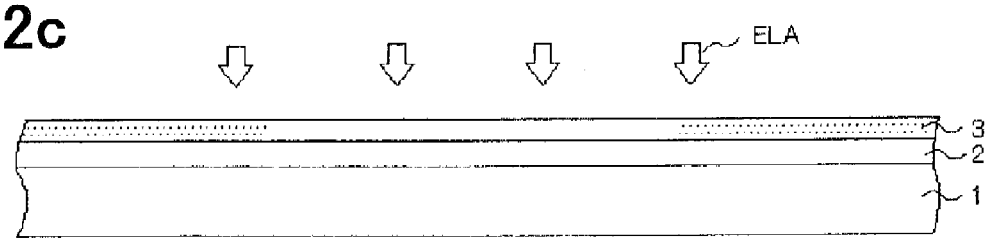

Then, as shown in FIG. 2c, the a-Si film 3a, for which doping has been performed for a part of n-channel TFTs and for a part of p-channel TFTs, is crystallized by annealing it with an excimer laser beam (ELA) to form a polycrystalline silicon film 3 having a non-doped region 8 and a B-doped region 9a.

Figure 2D:
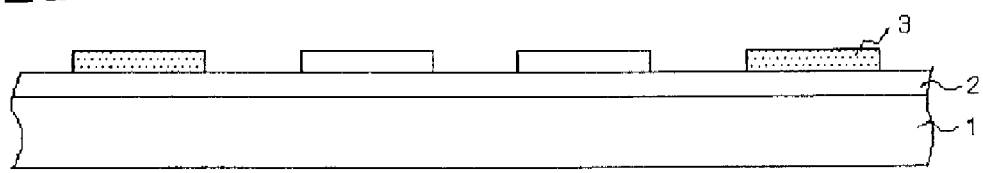
Figure 2E:
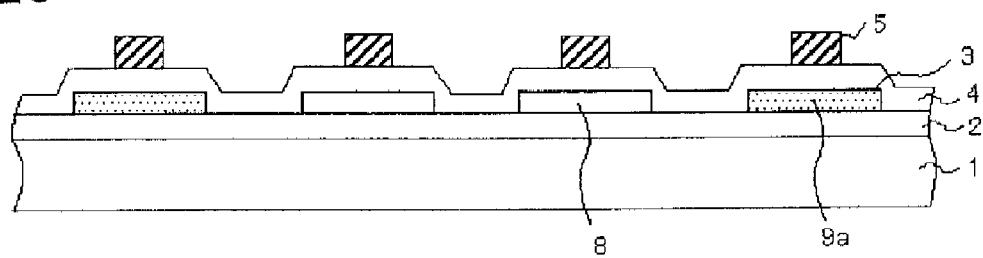

Next, as shown in FIG. 2d, the polycrystalline silicon film 3 is etched into an island pattern using the photolithography process and, as shown in FIG. 2e, a silicon oxide film is formed as a gate insulating film 4 using the LPCVD method, PCVD method, or spattering method. Preferably, the film thickness of this gate insulating film 4, which depends on the power supply voltage, TFT characteristics such as a VT, or specifications, is usually in the range 30 nm-200 nm. After that, a conducting material such as a metal, silicon, and silicide is deposited by the PCVD method or the spattering method and then patterning is performed on the conducting material using the photolithography process to form gate electrodes 5.

Figure 3A:
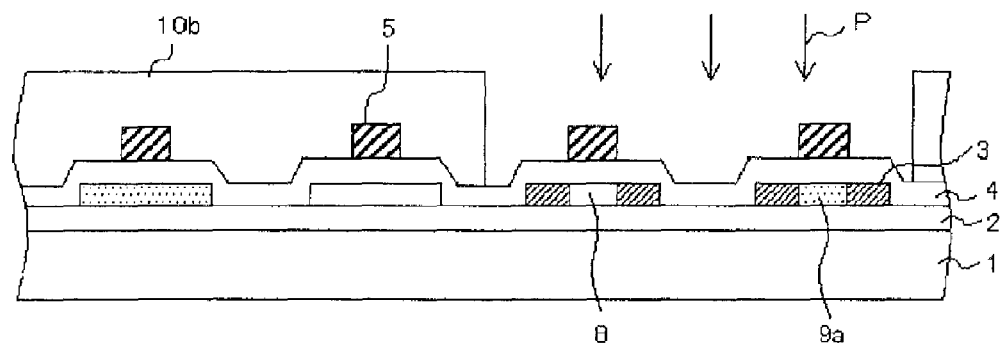
FIGS. 3a to 3c are process cross section diagrams illustrating the manufacturing method (B doping) of the thin film semiconductor device according to one embodiment of the present invention.
Figure 3B:
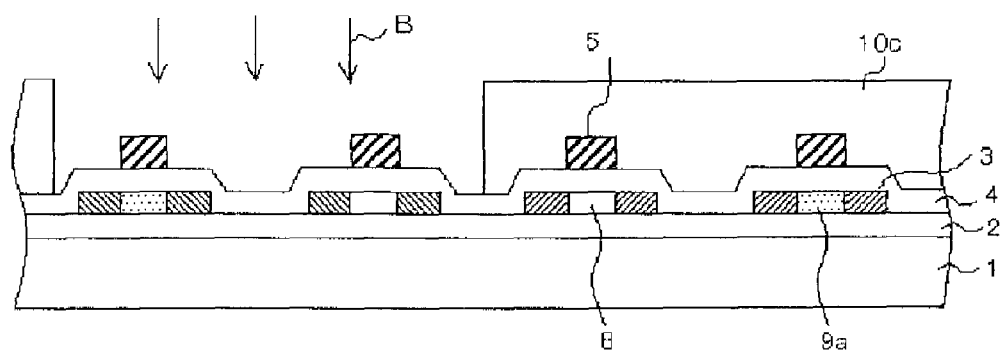

Next, as shown in FIG. 3a, the p-channel TFT forming region is covered by a resist pattern 10b and P (phosphor)-doping is performed for the n-channel TFTs with the gate electrodes 5 as the mask and, then, the n-channel TFT forming region is covered by a resist pattern 10c and B-doping is performed for the p-channel TFTs with the gate electrodes 5 as the mask in the similar manner to form the source/drain regions. Doping for the n-channel TFTs and doping for p-channel TFTs may be performed in any order; doping may be performed in reverse order.

To build the LDD (Lightly Doped Drain) structure to prevent a decrease in device reliability in the high field region near the drain, an impurity is implanted into an offset created in the gate using the resist pattern, low-density P is implanted with the gate electrodes 5 as the mask, and then activation is performed. The activation methods include orthodox thermal activation, laser activation using laser, and RTA (Rapid Thermal Anneal) using lamps or high-temperature $N_2$. The activation process most suitable for the structure of a gate metal should be selected.

Figure 3C:
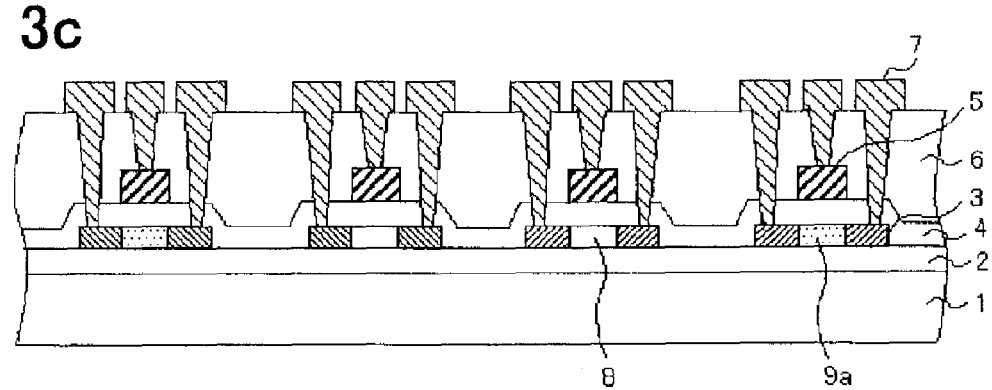

After that, hydrogen plasma processing is performed. Then, as shown in FIG. 3c, a silicon oxide film or a silicon nitride film is deposited as an inter-layer insulating film 6, contact holes are formed on the gates and the sources/drains, and metal electrodes are formed as electrode 7 to provide an electrode wiring structure. Usually, Al (aluminum) is used as the metal. After that, a passivation film such as a silicon nitride film, though not shown, is formed, and pad contact holes are created to form a thin film semiconductor device.

In the manufacturing method according to the present invention, when B-doping is performed for a part of n-channel TFTs, B-doping is performed also for a part of p-channel TFTs at the same time. This makes it possible to fabricate two types of TFTs of the same channel type, each with a different VT, without increasing the number of processes. In addition, because the same dopant (B) is added to the channel region of the low-VT n-type-TFT and the high-VT p-type-TFT almost at the same density, the symmetry of the VT can be maintained.

Figure 4:
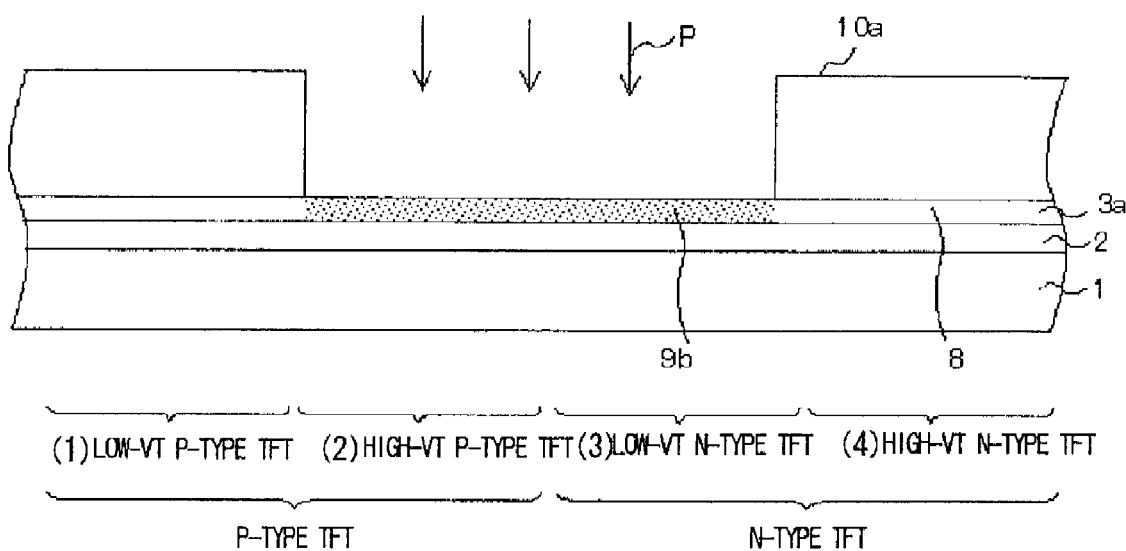
FIG. 4 is a process cross section diagram showing another manufacturing method (P doping) of the thin film semiconductor device according to one embodiment of the present invention.

In the above description, the method for controlling the VT of n-channel TFTs through B-doping is used also for controlling the VT of p-channel TFTs to control the VT of n-channel TFTs and p-channel TFTs. The same concept may be used also for some other method of creating two types of TFTs of the same channel type each with a different VT. For example, instead of performing B-doping in the process in FIG. 2(b), it is also possible to form the resist pattern 10a, as shown in FIG. 4, so that the center TFTs (high-VT p-type TFT and low-VT n-type TFT) are exposed and then perform p doping. This method increases the VT of the P-doped p-channel TFT and decreases the VT of the n-channel TFT. In this way, two types of TFTs each with one of two VTs may be created for n-channel TFTs and p-channel TFTs.

Figure 5A:
FIGS. 5a and 5b are process cross section diagrams illustrating another manufacturing method (B overall doping and P re-doping) of the thin film semiconductor device according to one embodiment of the present invention.
Figure 5B:
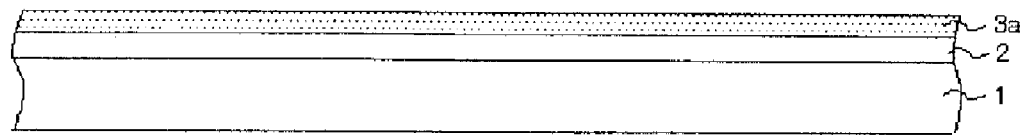
Figure 5B:
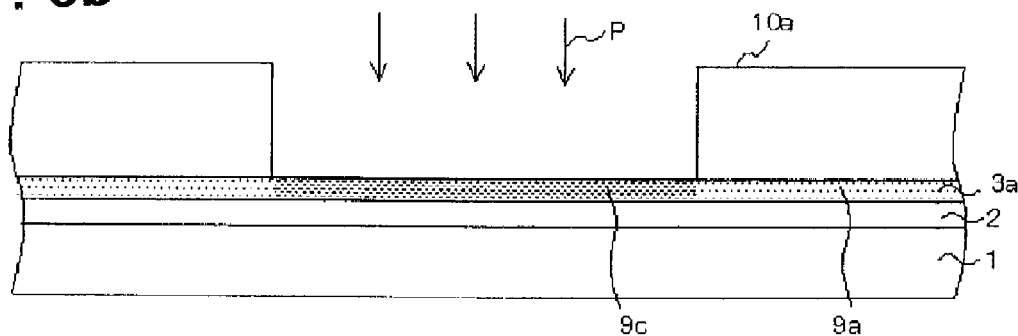
Figure 6A:
FIGS. 6a and 6b are process cross section diagrams illustrating another manufacturing method (P overall doping and B re-doping) of the thin film semiconductor device according to one embodiment of the present invention.
Figure 6B:
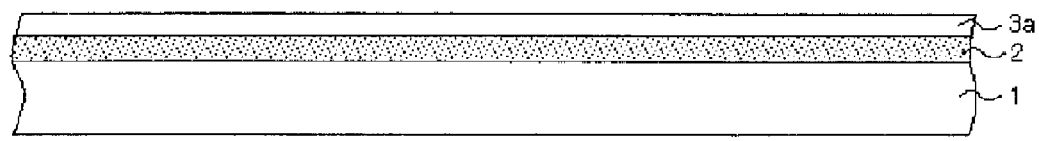
Figure 6B:
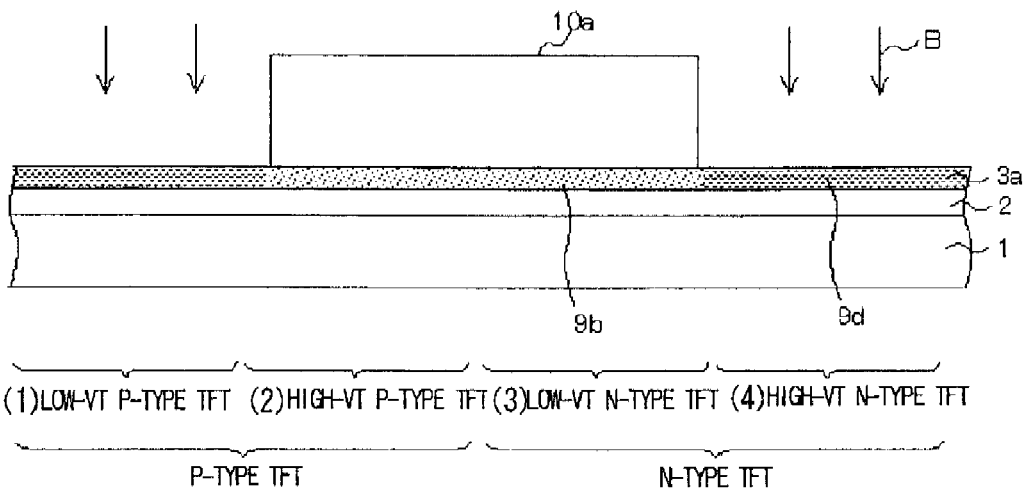

Although one step is added to the doping process of the method described above, it is also possible to fabricate TFTs, each with one of two VTs, for n-channel TFTs and p-channel TFTs by performing re-doping using a dopant of the opposite conductive type. For example, instead of performing B-doping for the two TFTs at both ends in the process shown in FIG. 2b, another method may also be used, as shown in FIG. 5, in which B-doping is performed for the whole region (both n-channel and p-channel TFTs) as shown in FIG. 5 (FIG. 5a), the resist patterns 10a is formed so that the center TFTs (high VT p-type TFT (2) and low VT n-type TFT (3)) are exposed, and then P-doping is performed (FIG. 5b). In this case, the n-type impurity density substantially decreases in the low-VT n-type TFT (3), the p-type impurity density increases in the high-VT p-type TFT (2), and two types of TFTs each with one of two VTs may be created for both n-channel TFTs and p-channel TFTs. In addition, a still another method may be used in which P-doping is performed for the whole region (both n-channel and p-channel TFTs) as shown in FIG. 6 (FIG. 6a), the resist pattern 10a is formed so that the TFTs at both ends (low-VT p-type TFT and high-VT n-type TFT) are exposed, and then B-doping is performed (FIG. 6b). In this case, the n-type impurity density increases in the high-VT n-type TFT (4), the p-type impurity density substantially decreases in the low-VT p-type TFT (1), and two types of TFTs each with one of two VTs may be created for both n-channel TFTs and p-channel TFTs.

In this way, by combining the configuration in which B-doping for controlling the VT of n-channel TFTs is used for p-channel TFTs, the configuration in which P-doping for controlling the VT of p-channel TFTs is used for n-channel TFTs, and the configuration in which B-doping or P-doping is not performed for a part of n-channel TFTs or p-channel TFTs, the TFTs each with one of multiple different VTs can be created for TFTs of the same channel type. By using TFTs each with one of different VTs to configure two types of circuits, that is, switches and logic circuits where the off-current characteristics are important and analog circuits where a low VT is required and the off-characteristics are not important, the characteristics of both types of circuits will improve.

The following describe some examples of analog circuits that include TFTs formed by the methods described above. Low-VT TFTs included in an analog circuit increase the operation speed and enlarge the dynamic range of the circuit. However, the problem with an analog circuit configured only by low-VT TFTs is that, when the analog circuit is inactive, power is consumed due to the leakage current. To solve this problem, a switch is provided composed of a high VT TFT for cutting off a leakage current generated by low VT TFTs when the circuit is inactive. This high-VT TFT switch is turned off when the circuit is inactive to minimize power dissipation due to a leakage current generated when the analog circuit is inactive.

Figure 7:
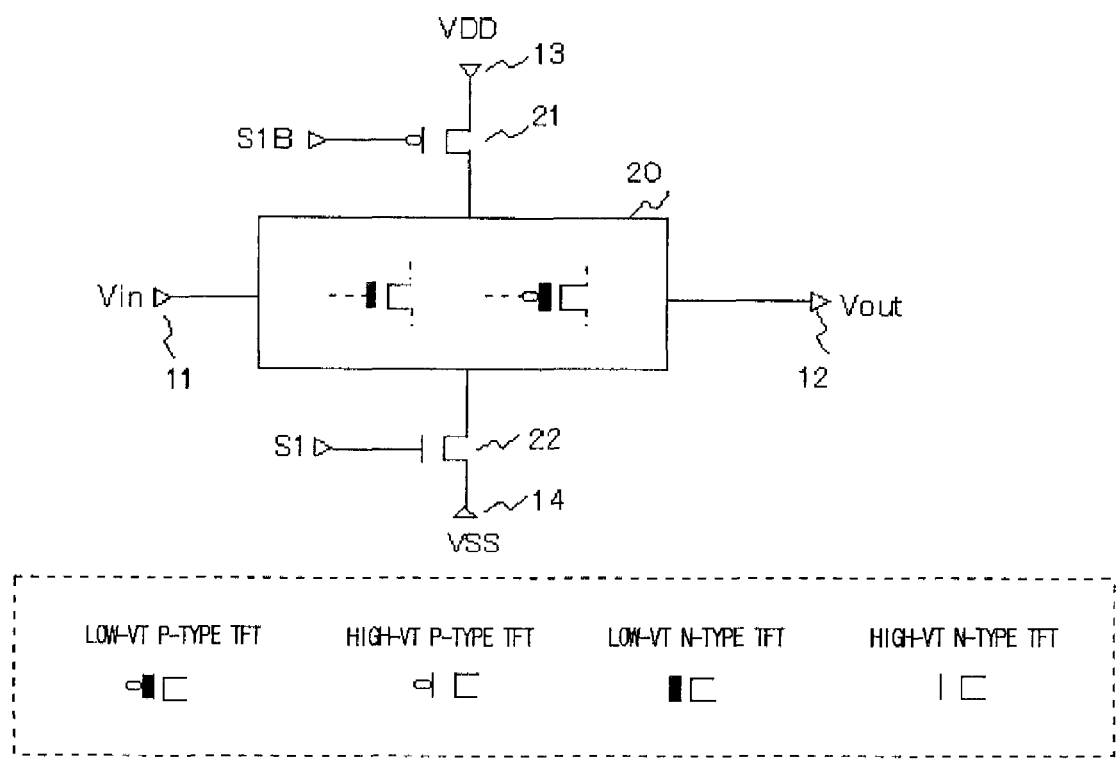
FIG. 7 is a circuit diagram showing the configuration of an analog circuit according to one embodiment of the present invention.

More specifically, a circuit in the present embodiment comprises an input terminal 11, an output terminal 12, a high-potential power supply terminal 13, a low-potential power supply terminal 14, an analog circuit 20 that includes low-VT TFTs, and switches 21 and 22 each composed of a high-VT TFT, as shown in FIG. 7. The analog circuit 20 outputs the output voltage Vout from the output terminal 12 in response to the input voltage Vin received by the input terminal 11. The switches 21 and 22, provided between the high-potential power supply terminal 13, low-potential power supply terminal 14, and the analog circuit 20, respectively, are controlled by a control signal S1 and a signal S1B which is an inverted signal of the control signal S1. The analog circuit 20 is activated (in operation) when the control signal S1 is high and the inversion signal S1B is low, while the analog circuit 20 is deactivated (stopped) when the control signal S1 is low and the inversion signal S1B is high.

When low-VT-TFTs are included in the current path routes among the terminals of the input terminal 11, output terminal 12, high-potential power supply terminal 13, and low-potential power supply terminal 14 in the configuration described above, the switches 21 and 22, each composed of a high-VT TFT, cut off the current path route in the configuration described above to stop the circuit and, at the same time, reduces power dissipation caused by a leakage current when the circuit is inactive. The effect of a potential fluctuation in the input terminal 11 and the output terminal 12, caused by a leakage current when the circuit is inactive, can also be reduced.

For example, even when there is a current path route, which includes low-VT TFTs, between the input terminal 11 and the low-potential power supply terminal 14, the switch 22 can cut off the current path. Similarly, even when there is a current path route, which includes low-VT TFTs, between the high-potential power supply terminal 13 and the output terminal 12, the switch 21 can cut off the current path. Even when there is a current path route between the high-potential power supply terminal 13 and the low-potential power supply terminal 14, one of the switch 21 and the switch 22 can cut off the current path.

Using the method of the present invention in this way, the analog circuit 20 including low-VT TFTs, coupled with the switches 21 and 22 composed of a high-VT TFT, can increase the performance of the analog circuit (the operation speed is improved and the dynamic range is enlarged) and prevent power dissipation caused by a leakage current. This leakage current prevention structure alleviates the limitation on the leakage current, generated when the low-VT TFTs in the analog circuit are off, even when the structure according to the present invention is applied to the driver circuit of a mobile device where low power dissipation is required. More specifically, the leakage current generated when a high-VT TFT is off must be equal to or lower than one ten-thousands (about $10^{-11}$ A) of the current (about $10^{-7}$ A) at the normal threshold voltage. On the other hand, the leakage current generated when a low-VT TFT is off is only required to be equal to or lower than the current (about $10^{-7}$ A) at the threshold voltage. This ensures design flexibility. Note that the current values described above are a rough measure.

The configuration of the analog circuit 20 can be applied to various types of analog circuit part, such as an amplifier circuit, a power supply circuit, a comparator, and a driver circuit. Although a low-VT TFT should preferably be of enhancement type, it may also be of slight depression type.

The detailed configuration of a circuit in one embodiment of the present invention will be described below. Although two types of TFTs, high-VT TFTs and low-VT TFTs, are provided in the circuit configuration described below for convenience of description, a third type of TFTs with a VT different from those of the two types described above may also be provided. In general, the off-leakage current of a low-VT TFT is larger than that of a high-VT TFT.

Figure 8:
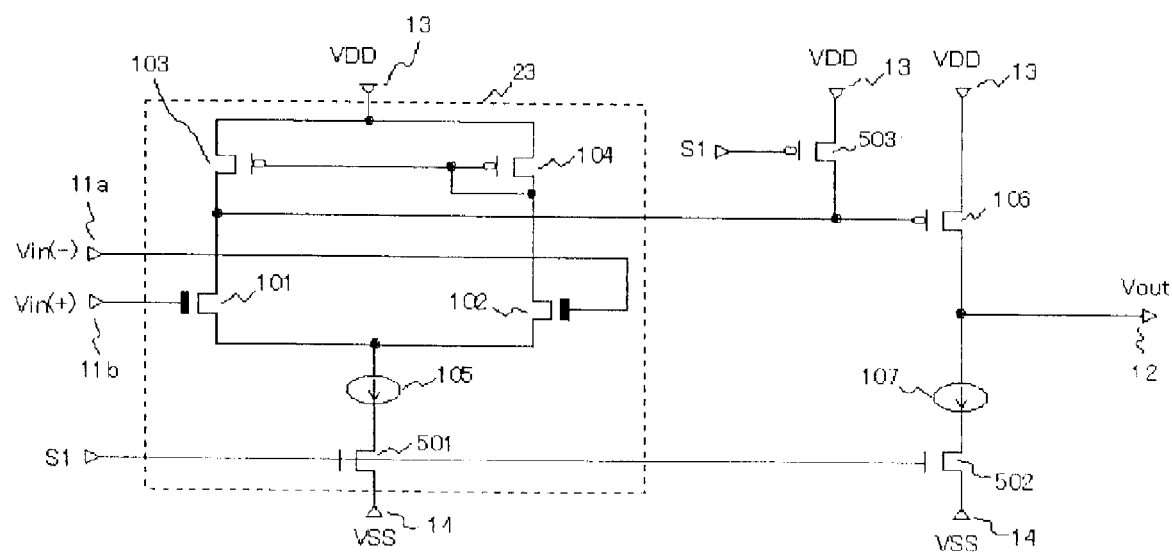
FIG. 8 is a circuit diagram showing the configuration of a differential amplifier circuit according to a first embodiment of the present invention.

First, an analog circuit comprising TFTs, which have two kinds of VTs, according to a first embodiment of the present invention will be described with reference to FIG. 8. FIG. 8 is a circuit diagram showing an example in which the configuration according to the present invention is applied to a differential amplifier circuit. In the description below, it is assumed that both high-VT TFTs and low-VT TFTs are insulated gate type transistors.

As shown in FIG. 8, the circuit according to the present embodiment is a differential amplifier circuit comprised of the differential stage and the amplifier stage wherein low-VT TFTs are used in the differential stage (23 in FIG. 8). In the differential amplifier circuit, the differential pair transistors 101 and 102 are composed by low-VT TFTs and a switch 501 for controlling to off current path to the differential pair 101 and 102 is composed by a high-VT TFT. All the components other than the differential pair 101 and 102 are composed by a high-VT TFT similar to the one used in the switch 501. Both the differential stage and the amplifier stage are analog circuits through which an idling current flows. In this embodiment, an example in which the only the differential pair transistors 101 and 102 are formed by low-VT TFTs will be described. The circuit in FIG. 8 will be described in detail. The differential stage comprises the differential pair comprised of n-channel transistors 101 and 102; a current source 105 connected in series with switch transistor 501 between the differential pair and a low-potential power supply terminal 14 to supply a current to the differential pair; and a current mirror circuit connected between the differential pair and a high-potential power supply terminal 13 and composed of p-channel transistors 103 and 104 to serve as an load circuit of the differential pair.

The input end of the current mirror circuit (connection point between the drain and the gate of the transistor 104) is connected to the drain of the transistor 102 constituting the differential pair, the output end is connected to the drain of the transistor 101 constituting the differential pair, and the drain of the transistor 101 is the output of the differential stage. The amplifier stage comprises a p-channel transistor 106 whose gate receives the output of the differential stage, whose source is connected to the high-potential power supply terminal 13, and whose drain is connected to an output terminal 12; a current source 107 and a switch transistor 502 connected in series between the output terminal 12 and the low-potential power supply terminal 14; and a switch transistor 503 connected between the gate of the p-channel transistor 106 and the high-potential power supply terminal 13. The switch transistors 501, 502, and 503 each receive the control signal S1. Because two differential input terminals are the gate terminals of insulated gate type transistors in the present embodiment, there is no current path between the differential input terminal and the power supply terminals or the output terminal.

When the differential amplifier circuit is activated, the control signal S1 is set high to turn on the switches 501 and 502 and to turn off the switch 503. This causes the output of the differential stage to change according to the potential difference between the two differential input voltages Vin(+) and Vin(−), a change in the gate voltage of the p-channel transistor 106 controls the drain current of the p-channel transistor 106, and the output voltage Vout is determined by the balance between the drain current and the current from the current source 107. For example, when the inverting input terminal (gate of the transistor 102) of the differential pair is connected to the output terminal 12, a voltage-follower circuit is built that outputs a voltage equal to the input voltage supplied to the non-inverting input terminal (gate of the transistor 101). During operation, an idling current controlled by the current source 105 flows through the differential pair composed by transistors 101 and 102 and the current mirror circuit composed by transistors 103 and 104 in the differential stage. On the other hand, in the amplifier stage, the idling current flowing through the p-channel transistor 106 depends on the circuit connected to the output terminal 12. When a constant discharging current flows from the output terminal 12 to an external circuit, the idling current flowing through the p-channel transistor 106 is the total current of the discharge current and the current controlled by the current source 107. When a capacitive load is connected to the output terminal 12, the idling current controlled by the current source 107 flows directly through the p-channel transistor 106 in the stable operation state after the capacitor is completely charged or discharged.

On the other hand, when the circuit is deactivated, the control signal S1 is set low to turn off the switches 501 and 502 and to turn on the switch 503. Because the switch 501 is turned off in the differential stage, the current flowing into the low-potential power supply terminal 14 is cut off and the output of the differential stage is changed to the high potential power supply voltage VDD side. Because the switch 503 is turned on in the amplifier stage, the voltage of the gate of the p-channel transistor 106 is increased to the high potential power supply voltage VDD and the p-channel transistor 106 is turned off. In addition, the switch 502 is turned off and hence the current path between the output terminal 12 and low-potential power supply terminal 14 is cut off. In this way, the differential amplifier circuit is activated or deactivated according to the value of the control signal S1.

The dynamic range (output voltage range with respect to the power supply voltage range) of this differential amplifier circuit is narrower than the range, from the upper limit that is the high potential power supply voltage VDD to the lower limit that is the low potential power supply voltage VSS, by the threshold voltage of the n-channel transistors 101 and 102. Accordingly, the differential pair transistors 101 and 102 in the configuration in FIG. 8, composed of low-VT TFTs, enlarges the operation range of the differential stage 23 and thus extends the dynamic range of the differential amplifier circuit. When this differential amplifier circuit is deactivated, the current path to the differential pair transistors 101 and 102 composed of the low-VT TFTs is cut off by the switch 501 composed of a high-VT TFT and hence, the leakage current does not increase the power dissipation.

Figure 9:
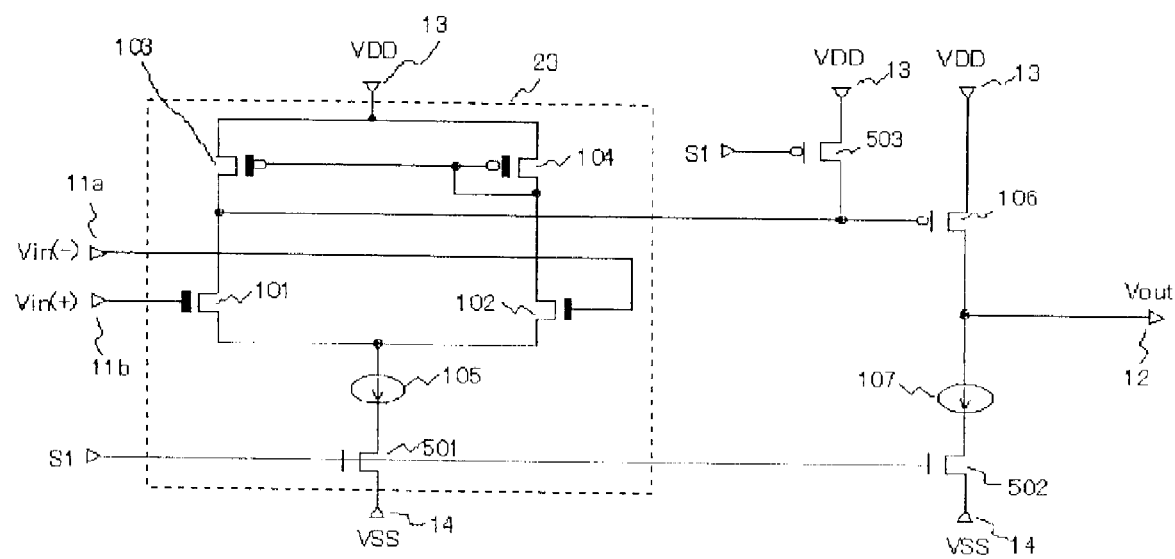
FIG. 9 is a circuit diagram showing another configuration of a differential amplifier circuit according to a second embodiment of the present invention.

Next, an analog circuit comprising TFTs, having two kinds of VTs, in accordance with a second embodiment of the present invention will be described with reference to FIG. 9. FIG. 9 shows a differential amplifier circuit in which low-VT TFTs are used in the differential stage (23 in FIG. 9). That is, in this differential amplifier circuit, a differential pair comprised of transistors 101 and 102 and a current mirror circuit comprised of transistors 103 and 104 are formed by low-VT TFTs, and a switch 501 for cutting off a current path to the differential pair and the current mirror circuit is formed by a high-VT TFT. All the components other than the differential pair comprised of transistors 101 and 102 and the current mirror circuit comprised of transistors 103 and 104 are formed by a high-VT TFT similar to that used for the switch 501.

The differential pair transistors 101 and 102, composed of low-VT TFTs, extend the operation range of the differential stage 23 as in FIG. 8 and hence the dynamic range of the differential amplifier circuit is enlarged. In addition, the current mirror transistors 103 and 104, composed of low-VT TFTs, reduces the load that acts as the load circuit of the differential pair, thus speeding up the operation response of the current mirror circuit and increasing the operation speed of the differential amplifier circuit. It is also possible to constitute the differential amplifier circuit by using low-VT TFTs only for the current mirror circuit (transistors 103 and 104) and by using a high-VT TFT for the switch 501 for cutting off the current path to the differential pair. Such a configuration can also increase the performance of the differential amplifier circuit with the use of low-VT TFTs as in the differential amplifier circuit in FIG. 8 and can prevent the power dissipation, generated by the leakage current of a low-VT TFT, from being increased with the use of the switch 501 composed of a high-VT TFT.

Figure 10:
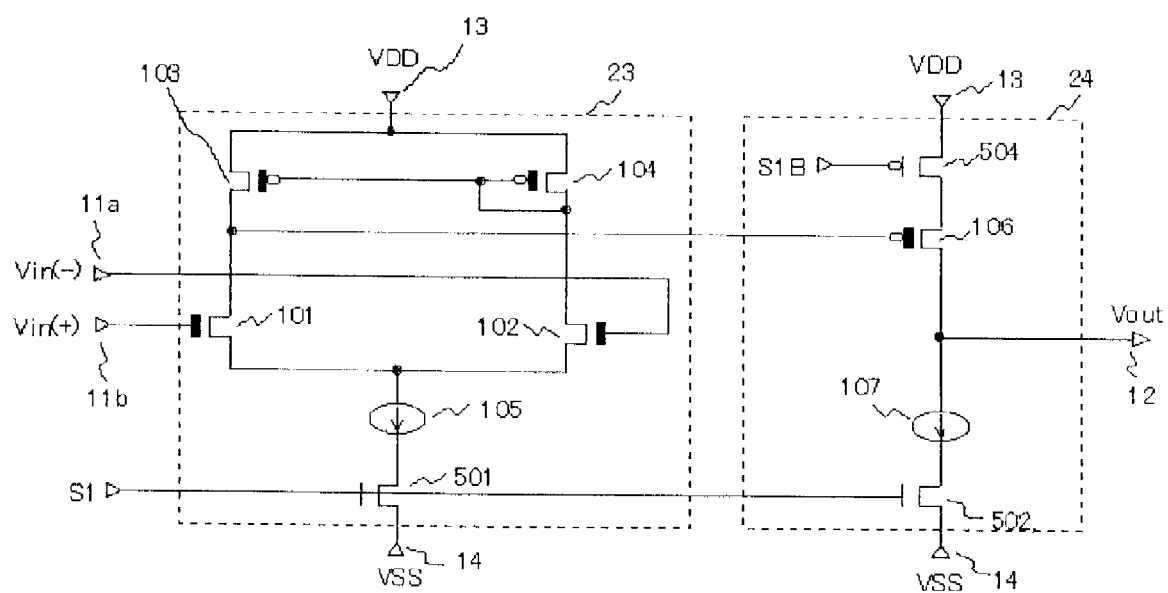
FIG. 10 is a circuit diagram showing another configuration of a differential amplifier circuit according to a third embodiment of the present invention.

Next, an analog circuit comprising TFTs, having two kinds of VTs, in accordance with a third embodiment of the present invention will be described with reference to FIG. 10. FIG. 10 is a circuit diagram showing another example in which the structure of the present invention is applied to a differential amplifier circuit.

As shown in FIG. 10, the circuit in the present embodiment is a differential amplifier circuit in which low-VT TFTs are used in the differential stage (23 in FIG. 10) and the amplifier stage (24 in FIG. 10). That is, in this differential amplifier circuit, a differential pair (101 and 102) and a current mirror circuit (103 and 104) are formed by low-VT TFTs, a switch 501 for cutting off a current path to the differential pair and the current mirror circuit is formed by a high-VT TFT, a p-channel transistor 106 in the amplifier stage is formed by a low-VT TFT, and a switch 504 for cutting off a current path between a high potential power supply terminal 13 and an output terminal 12, along which the p-channel transistor 106 is provided, is formed by a high-VT TFT.

The switch transistor 504, is connected in series with the p-channel transistor 106 between the high-potential power supply terminal 13 and the output terminal 12. This is because, unless the switch transistor 504 is connected in series with the p-channel transistor 106, the leakage current of the p-channel transistor 106 composed of a low-VT TFT sometimes increases the voltage of the output terminal 12 when the differential amplifier circuit is inactive. The gate of the switch transistor 504 receives the inversion signal S1B of the control signal S1 to turn on the switches 501 and 502 when the differential amplifier circuit is active and to turn off the switches 501 and 502 when the differential amplifier circuit is inactive.

One of the effects of this embodiment is that, when low-VT TFTs are used in the differential stage (23 in FIG. 10), the operation range of the differential stage 23 is enlarged as with the embodiment shown in FIG. 9 and therefore the dynamic range of the differential amplifier circuit is enlarged. Because, the p-channel transistor 106 in the amplifier stage (24 in FIG. 10) is formed by a low-VT TFT in this embodiment, the turn-on area of the p-channel transistor 106 in the power supply range is extended, the upper limit of the transistor current drive power in the change range of the differential stage output (gate voltage of transistor 106) is raised, and hence the operation speed of the differential amplifier circuit is improved. Again, in the present embodiment, the performance of the differential amplifier circuit may be improved with no added power dissipation.

Figure 11:
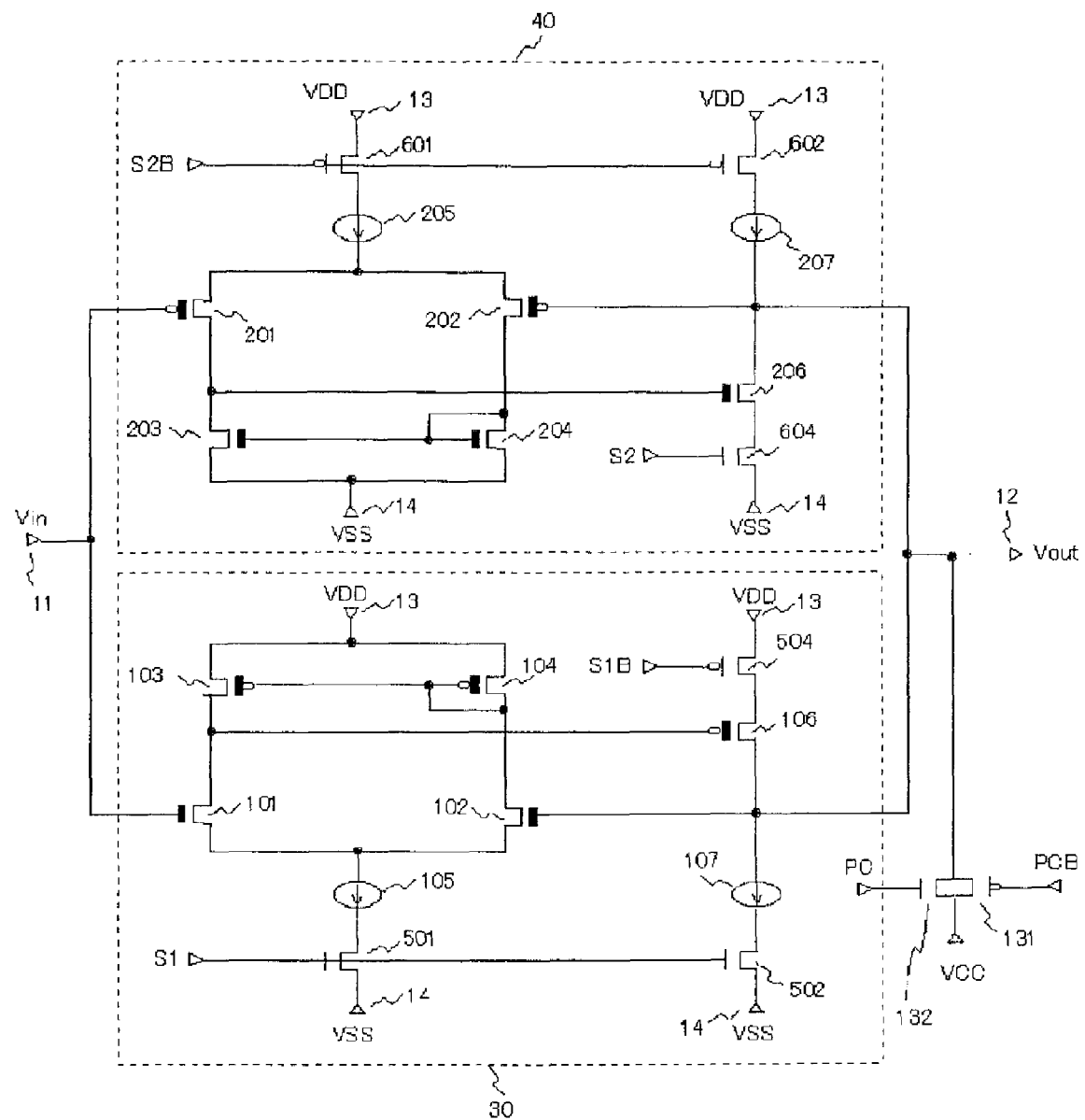
FIG. 11 is a circuit diagram showing the configuration of a driver circuit according to a fourth embodiment of the present invention.

Next, an analog circuit comprising TFTs, having two kinds of VTs, in a fourth embodiment of the present invention will be described with reference to FIG. 11. FIG. 11 is a circuit diagram showing an example in which the structure of the present invention is applied to a differential amplifier circuit.

In this embodiment, a differential amplifier circuit is built by combining two differential amplifier circuits (30 and 40 in FIG. 11): differential amplifier circuit in FIG. 10 and differential amplifier circuit with a configuration symmetrical in transistor polarity to that of the circuit in FIG. 10. In the two differential amplifier circuits 30 and 40 in FIG. 11, the inverting input terminal is each connected to the output terminal and, in addition, the output terminals are tied together to an output terminal 12. The two differential amplifier circuits each constitute a voltage-follower configuration in which the inverting input terminals are tied together to the output terminal 12. The two differential amplifier circuits may be started or stopped individually by the control signals S1 and S2 and the inversion signals S1B and S2B.

The differential amplifier circuit in FIG. 11 can perform the high-speed charging operation via the p-channel transistor 106 when the differential amplifier circuit 30, activated by the control signals S1 and S1B, is in operation. Also, the differential amplifier circuit can perform the high-speed discharging operation via the n-channel transistor 206 when the differential amplifier circuit 40, activated by the control signals S2 and S2B, is in operation. By controlling the control signals S1, S1B, S2, and S2B (S1B and S2B are the inversion signals of S1 and S2), the high-speed charging operation and the high-speed discharging operation can be switched as required and hence, the differential amplifier circuit in FIG. 11 can perform the high-speed operation even when power is decreased by suppressing the electric current flowing to the current sources 107 and 207.

The output terminal 12 is connected to the power supply VCC via complementary switches 131 and 132 controlled by the signals PC and PCB. This allows the voltage of the output terminal 12 to be charged or discharged preliminarily to the power supply voltage VCC as required. Although the operating range of each of the two differential amplifier circuits, 30 and 40, in FIG. 11 is narrower by the threshold voltage of the transistors of the differential pair, the driver circuit in FIG. 11 has an operating range equal to the power supply voltage range by performing the preliminary charge or preliminary discharge by means of the power supply VCC. The power supply VCC may be a variable power supply having a plurality of voltage levels.

Figure 12:
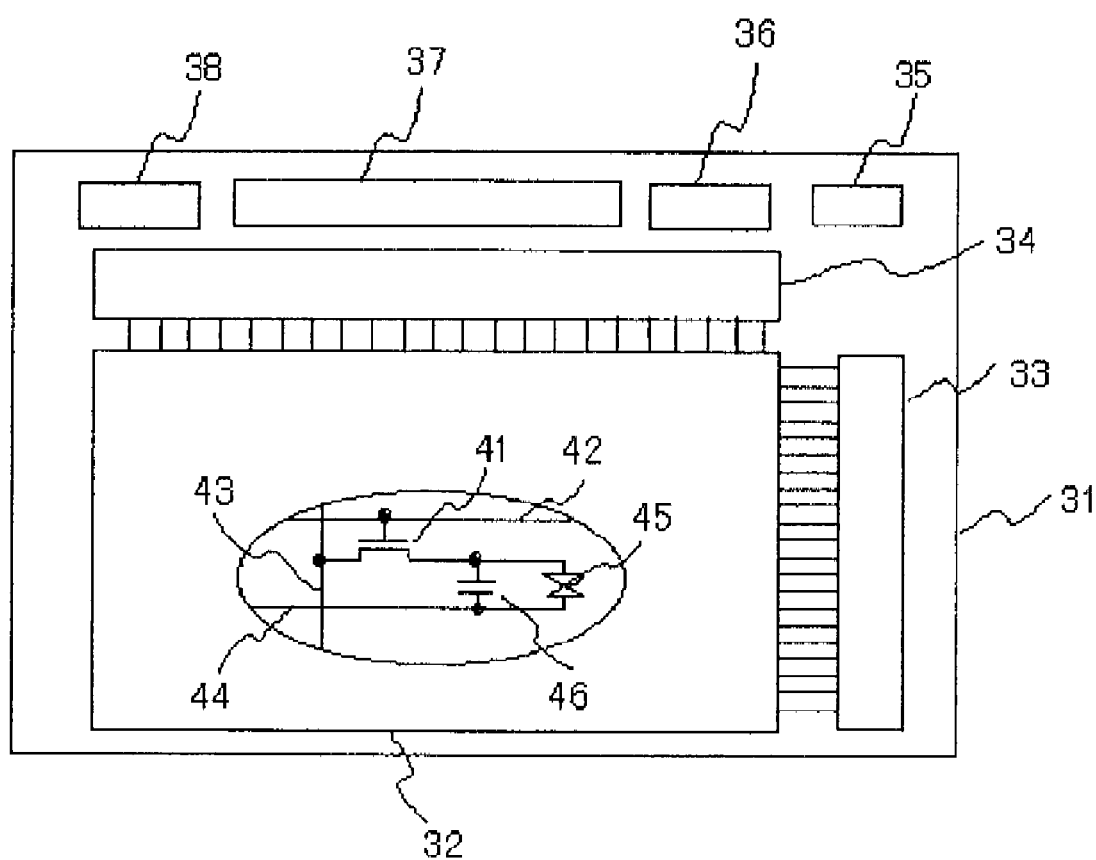
FIG. 12 is a diagram showing the configuration of the driver circuit of a liquid crystal display device according to fifth embodiment of the present invention.
Figure 13:
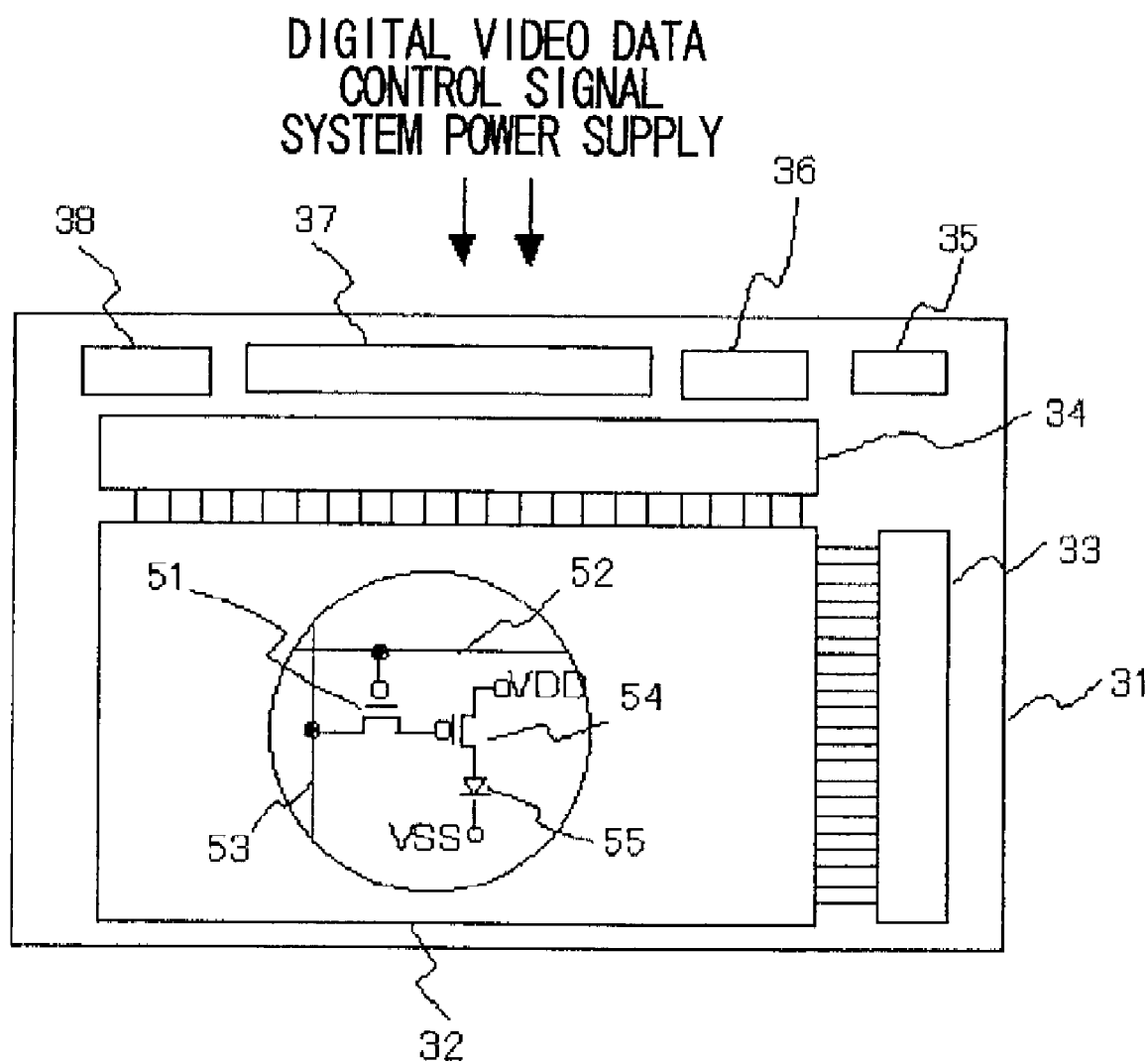
FIG. 13 is a diagram showing the configuration of the driver circuit of an organic EL display device according to another embodiment of the present invention.
Figure 14:
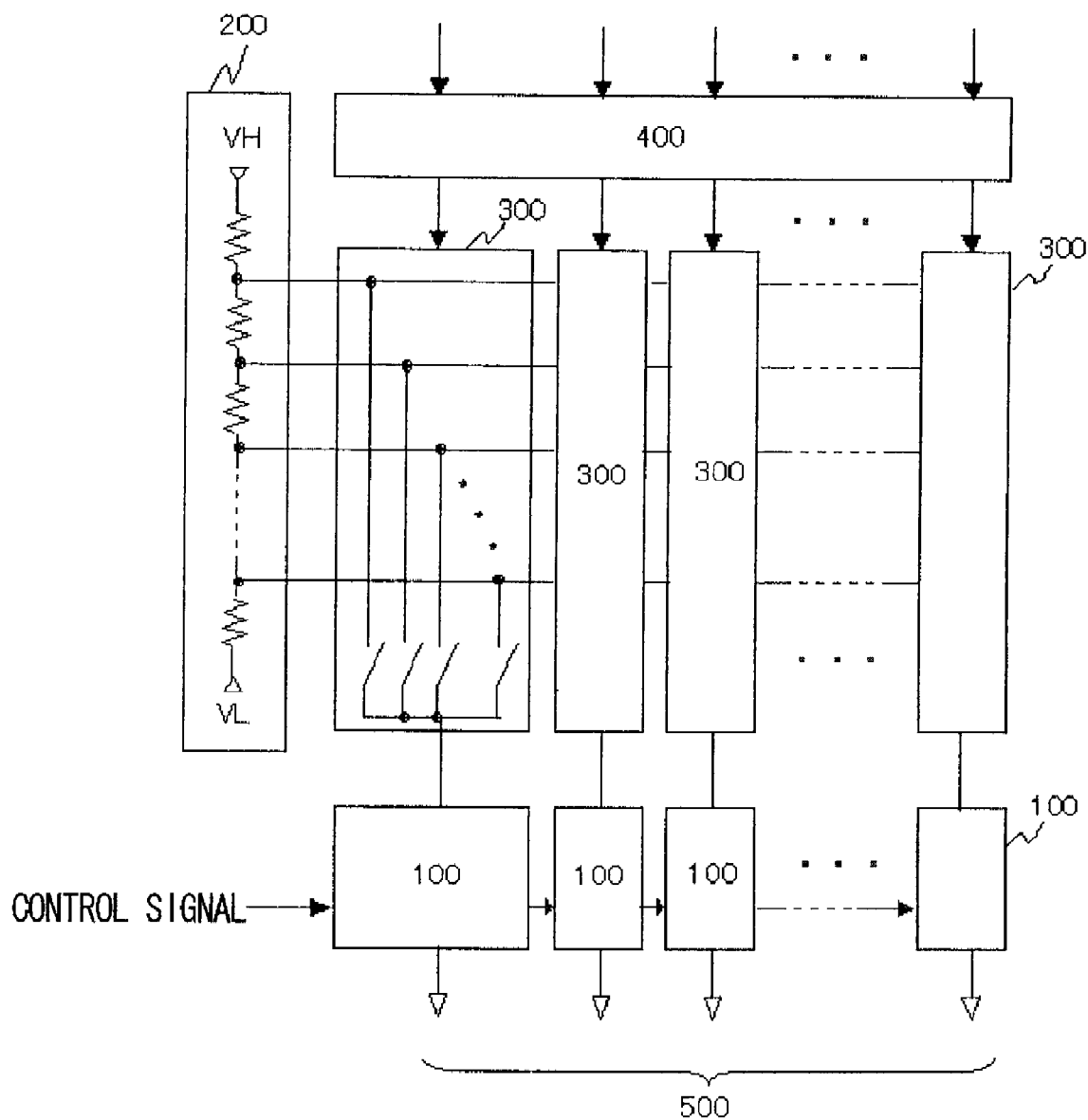
FIG. 14 is a diagram showing the detailed configuration of a data driver according to still another embodiment of the present invention.
Figure 15:
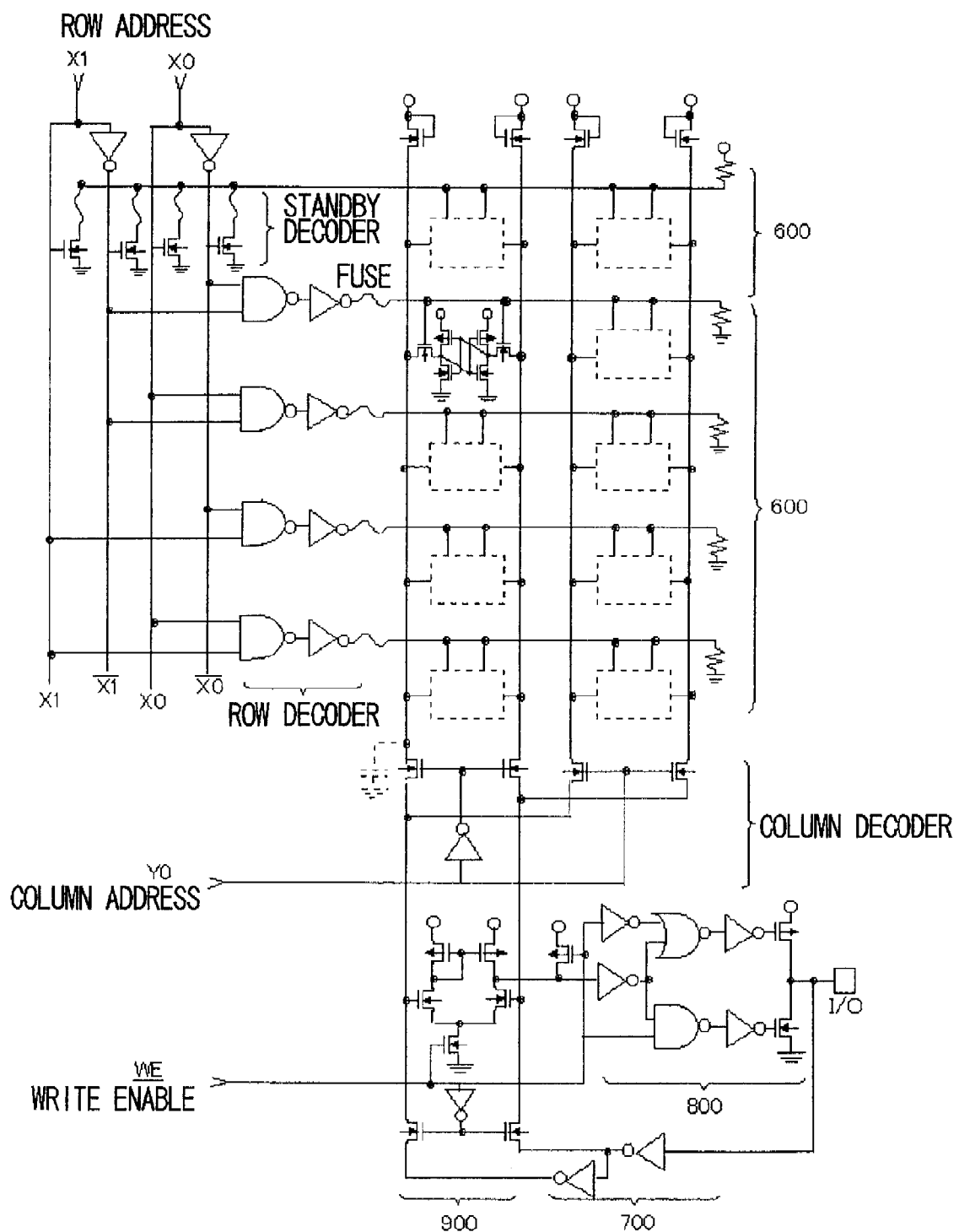
FIG. 15 is a diagram showing the detailed configuration of a memory according to still another embodiment of the present invention.

Next, a circuit configuration for a display device formed on an insulating substrate having TFTs thereon, having two kinds of VTs, in a accordance with a fifth embodiment of the present invention will be described with reference to FIGS. 12-15. FIG. 12 is a diagram showing an example in which the present invention is applied to a liquid display device, and FIG. 13 is a diagram showing an example in which the present invention is applied to an organic EL display device. FIGS. 14 and 15 are diagrams showing the detailed circuit configurations.

FIG. 12 shows an example of the circuit block diagram of a TFT substrate on which a display unit and driver and peripheral circuits, such as a display controller and driver, necessary for driving the display unit are formed on the same insulating substrate. Referring to FIG. 12, a system power supply, a digital video signal, and control signals are sent from outside the TFT substrate 31. These signals are sent to a display controller 36, and the digital video signal is sent to a memory 37. The digital video signal can be sent in various ways; for example, they are sent in conjunction with the address signal or sent serially or in parallel. Necessary signals and necessary circuits are provided according to the way the signal is sent. The operation of each block is controlled by the control signal sent from the display controller 36. A power supply circuit 35 generates the power supply voltage, necessary for each block, based on the system power supply. The digital video signal is stored in the memory 37, and the video signal that is read from the memory 37 according to the timing is sent to a data driver 34. The data driver 34, composed of a gray-scale voltage generation circuit, data latch, decoder, output amplifier, and so on, uses the output amplifier to amplify the gray-scale voltage selected according to the digital video signal and outputs the amplified voltage to data lines 43. A gate driver 33 outputs a scan signal that sequentially selects gate lines 42. The display unit 32 is composed of the gate lines 42 and data lines 43 that are intersected. Preferably, the memory 37 should be able to store one or more frames of image data.

Referring to FIG. 12, the display unit 32 has an active matrix configuration. An active matrix display unit has the pixels arranged in a matrix. Each pixel has a TFT 41, whose gate line 42 is connected to the control terminal of the TFT 41, whose drain is connected to the data line 43, and whose source is connected to the pixel electrode. Although omitted in FIG. 12, an opposed substrate with transparent electrodes is provided in a position opposed to the TFT substrate 31 with liquid crystal between the TFT substrate 31 and the opposed substrate. The liquid crystal between the pixels and the electrodes (common line 44) of the opposed substrate each form a liquid crystal capacitor 45, which works with a storage capacitor 46 to hold the difference in voltages applied to both ends of the capacitor and controls the liquid crystal transmittance to perform multi-level tone display. A common driver 38 generates a voltage signal to be applied to the electrodes of the opposed substrate and sends the signal from the TFT substrate to the electrodes (common line 44) of the opposed substrate.

Because the display unit 32, its driver circuit, and the peripheral circuits are integrated on the TFT substrate 31 shown in FIG. 12, the TFTs and the interconnections can be formed in one process. According to the present invention, the TFTs having two kinds of VTs (high-VT TFT and low-VT TFT) for each polarity can be formed on the insulating substrate (TFT substrate 31) at the same time. A low-VT TFT can be applied to an analog circuit part that requires an idling current during circuit operation, while a high-VT TFT can be applied to a logic circuit and a switch. This configuration contributes to improve the operation speed and to enlarge the dynamic range of an analog circuit without increasing power dissipation, thus increasing the performance of a display unit.

FIG. 13 is a circuit block diagram of a display unit whose display part and whose driver circuit and peripheral circuits are integrated and formed on an insulating substrate as in FIG. 12. In FIG. 13, there is illustrated a circuit block diagram of the TFT substrate of a typical organic EL display unit. In FIG. 13, the same reference numerals as in FIG. 12 are used for elements corresponding to elements in FIG. 12. The display unit 32 in FIG. 13 also has an active matrix configuration. The active matrix display part of the organic EL display unit has the pixels arranged in a matrix. Each pixel is composed of a switching TFT 51, a current control TFT 54, and a light-emitting diode OLED 55 (Organic Light Emitting Diode) formed by an organic thin film. The control terminal of the TFT 51 is connected to a gate line 52, the drain is connected to a data line 53, and the source is connected to the control terminal of a TFT 54. The source of the TFT 54 is connected to the high potential power supply VDD, the drain is connected to one end of the OLED, and the low potential power supply voltage VSS is connected to the other end of the OLED. The low potential power supply VSS is supplied to the electrode, not shown, formed on the cathode substrate. When the TFT 51 is turned on and the voltage corresponding to the image signal is supplied to the TFT 54, the TFT 54 causes the current, corresponding to the voltage difference from the high potential power supply voltage VDD, to flow to the OLED 55 that emits light according to the light intensity corresponding to the amount of current. In this way, the multi-level tone display can be performed by controlling the current that flows to the OLED 55. A common driver 38 in FIG. 13, a circuit that generates the voltage VSS to be supplied to the electrode of the cathode substrate, need not be provided when the voltage VSS is GND.

Because the display unit, its driver circuit, and the peripheral circuits are integrated on the TFT substrate 31 shown in FIG. 13, the TFTs and interconnections can be formed in one process. According to the present invention, the TFTs having two kinds of VTs (high-VT TFT and low-VT TFT) for each polarity can be formed on the insulating substrate (TFT substrate 31) at the same time. A low-VT TFT can be applied to an analog circuit that requires an idling current during circuit operation, while a high-VT TFT can be applied to a logic circuit and a switch. This configuration improves the operation speed and enlarges the dynamic range of an analog circuit without increasing power dissipation as in FIG. 12, thus increasing the performance of a display unit.

The circuits in FIGS. 12 and 13 will be described more in detail. An example of an analog circuit in FIG. 12 and FIG. 13 is the output amplifier of the data driver 34, the regulator of the power supply circuit 35, the sense amplifier of the memory 37, and so on. Forming some of those components with low-VT TFTs enlarges the dynamic range and improves the operation speed, thus improving the performance of the display unit. For example, the improvement of the operation speed of the output amplifier of the data driver 34 according to the present invention would reduce the time needed to output the gray-scale voltage to the data line 43 and hence a high-definition panel where high-speed driving of data lines is required may be implemented.

An example of a logic circuit or a switch is the gate driver 33, the display controller 36, or the switch (TFT 41 in FIG. 12) in the pixel part of the display unit 32. The TFTs included in the circuits are built by high-VT TFTs to prevent an increase in power dissipation or a malfunction due to a leakage current. The data driver 34 and the memory 37 also include many logic circuits or switches. That is, though built mainly by logic circuits, a circuit block may include some analog circuits. A typical example of such a circuit block is shown in FIG. 14 and FIG. 15.

FIG. 14 is a diagram showing an example of the configuration of the data driver 34. The data driver in FIG. 14 comprises a gray-scale voltage generation circuit 200, a latch 400, decoders 300, amplifier circuits 100, and output terminals 500. The gray-scale voltage generation circuit 200, composed of a resistor string having one end connected to the power supply voltage VH and the other end connected to the power supply voltage VL, outputs a gray-scale voltage (multi-valued level voltage) which are generated from each tap of the resistor string. The latch 400 receives video digital data, received by the data driver 34, and outputs the data to the decoders 300 at predetermined timing. The decoder 300 selects a gray-scale voltage, corresponding to the digital data output by the latch 400, for output to the amplifier circuit 100. The amplifier circuit 100 amplifies the received gray-scale voltage and outputs it to the output terminal connected to the data line (43 in FIG. 12, 53 in FIG. 13). Video digital data sent from the external of the data driver to the latch 400 is read from the memory 37 in FIG. 12 or FIG. 13 and is preferably sent directly to the latch 400 in the parallel form. If the data is sent serially, it is also possible to provide a shift register to sequentially receive the data into the latch 400 in synchronization with the clock signal. In FIG. 14, the latch 400 is a logic circuit. The decoder 300, which is a circuit for processing multi-valued levels and is comprised of switches, and the latch 400 are formed by high-VT TFTs. By contrast, the amplifier circuit 100 is an analog circuit to which the differential amplifier circuit, such as the one shown in FIGS. 8-10, may be applied. The present invention, if applied to the amplifier circuit 100, could improve the operation speed and enlarge the dynamic range of the amplifier circuit 100 without increasing power dissipation. The description of the gray-scale voltage generation circuit 200 in FIG. 14, which does not include TFTs, is omitted here.

FIG. 15 is a diagram showing an example of the configuration of the memory 37 built by forming a static RAM on an insulating substrate. This static RAM is described in the publication titled "Basics of MOS Integrated Circuits", Number 5 of VLSI introduction series, Kindai Kagaku Shuppan, pp. 64. The static RAM comprises a memory cell array 600, a data input buffer 700, a data output buffer 800, a sense amplifier 900, and so on. In the memory shown in FIG. 15, data is written into, or read from, a memory cell 600 specified by a row address and a column address according to the level (low level, high level) of the write enable signal. The sense amplifier 900 amplifies data read from the memory cell 600 to speed up the read operation. In FIG. 15, a memory cell 600 is constituted by a flip-flop, the data input buffer 700, and the data output buffer 800, each formed by high-VT TFTs, form a logic circuit. By contrast, the sense amplifier 900 has a configuration almost similar to that of the differential stage in FIGS. 8-10 (21 in FIG. 15). As in the differential stage in FIGS. 8-10, the differential pair and the current mirror circuit are formed by low-VT TFTs and a switch for cutting off the current path to these circuits is formed by a high-VT TFT. This configuration improves the operation speed, and enlarges the operating range, of the sense amplifier 900 without increasing power dissipation.

The present invention may be applied to an analog circuit that may be included in any circuit on an insulating substrate. For example, although only a switch TFT is used in the pixel part in FIGS. 12 and 13, a variety of function circuits may be provided also in the pixel part. The present invention, if applied to this configuration in which analog circuits are also included, could improve performance.

Even when a circuit block such as the data driver in FIG. 14 or the memory in FIG. 15 is formed on an insulating substrate singly to create a chip, it is easily understood that the present invention can be applied to an analog circuit to provide higher performance than ever before without increasing chip power dissipation.

As described in the above embodiments, configuring a circuit with low-VT TFTs and high-VT TFTs fabricated in the method according to the present invention can improve the performance of an analog circuit by using low-VT TFTs and can prevent a current leakage by using high-VT TFTs. To make the effect of the present invention clearer, the problems with a configuration (a case not included in the present invention) in which low-VT TFTs are used in a logic circuit such as an inverter or a switch will be described.

Figure 16A:
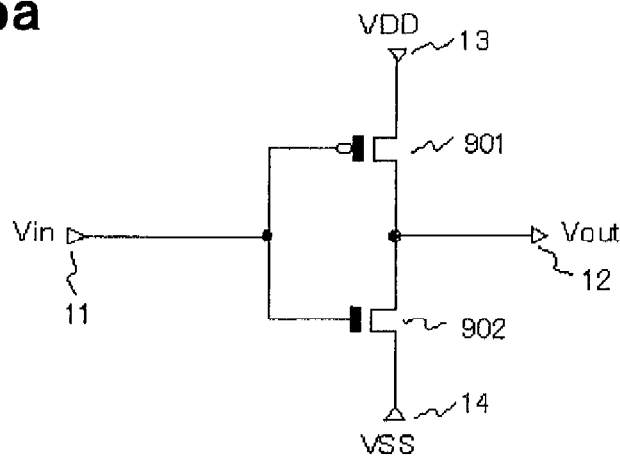
FIGS. 16a to 16c are circuit diagram showing the effect of the present invention.

FIG. 16a shows a digital circuit configured by using low-VT TFTs for an inverter. The inverter in FIG. 16a comprises a p-channel transistor 901 and an n-channel transistor 902. The inverter operates as follows. When the input Vin is at a low level(VSS), the p-channel transistor 901 is turned on, the n-channel transistor 902 is turned off, and the output Vout rises to a high level(VDD); when the input Vin is at a high level(VDD), the p-channel transistor 901 is turned off, the n-channel transistor 902 is turned on, and the output Vout falls to a low level (VSS).

As described above, one of the p-channel transistor 901 and the n-channel transistor 902 is off. However, the problem is that, when the p-channel transistor 901 and the n-channel transistor 902 are formed by low-VT TFTs and off-leakage current is relatively large, the operation speed of the inverter is improved but the power dissipation is increased by the leakage current of the off-state transistor. By contrast, the configuration according to the present invention where low-VT TFTs are used for analog circuits improves the operation speed without increasing the power dissipation.

Figure 16B:
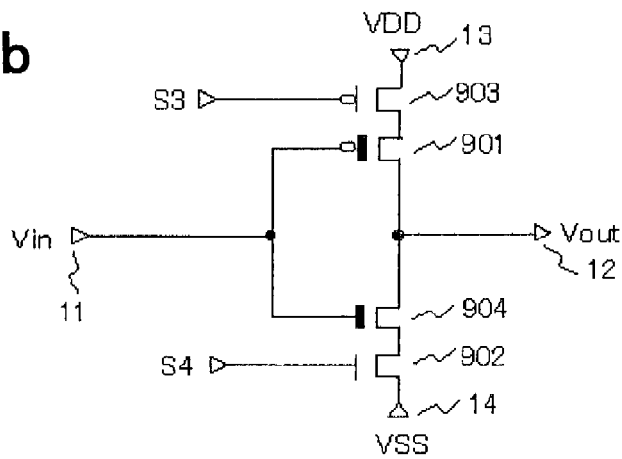

FIG. 16b is a diagram showing the configuration (a case not included in the present invention) in which low-VT TFTs are applied to a clocked inverter. Referring to FIG. 16b, a switch transistor 903 is connected between an inverter formed by low-VT TFTs shown in FIG. 16a and a high-potential power supply terminal 13, a switch transistor 904 is connected between the inverter shown in FIG. 16a and a low-potential power supply terminal 14, and control signals S3 and S4 are sent respectively to the gate of the switch transistors 903 and 904.

When both high-VT TFT transistors 903 and 904 are off in the configuration in FIG. 16b, the current path is completely cut off. Accordingly, even if the leakage current of the transistors 901 and 902 formed by low-VT TFTs is large, the operation is not affected. However, when at least one of high-VT TFT transistors 903 and 904 is on, the operation may be affected. For example, when the transistors 901, 902, 903, and 904 are off, on, on, and off, respectively, the leakage current from the transistor 901, if large, would cause electric charge to flow from the high-potential power supply terminal 13 into the output terminal 12 and sometimes cause a malfunction.

Figure 16C:
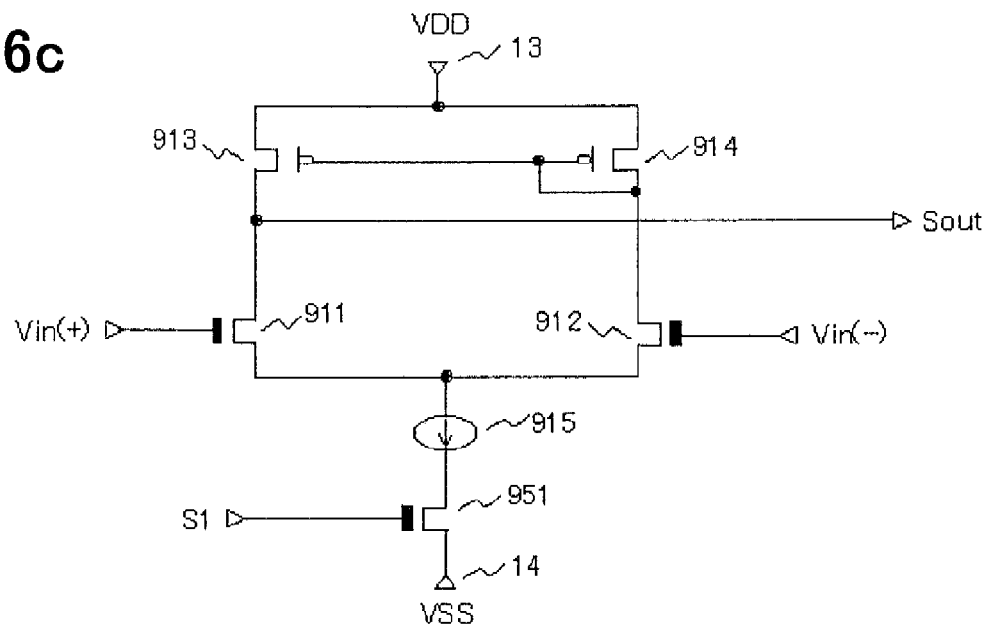

FIG. 16c is a diagram showing the configuration (a case not included in the present invention) in which low-VT TFTs are applied to a switch. FIG. 16c shows a configuration similar to that of the differential stage in FIG. 8 except that a low-VT TFT switch 951 is used instead of the high-VT TFT switch transistor 501. In this configuration, a switch composed of a high-VT TFT is not provided on the current path route including a differential pair comprised of low-VT TFTs 911 and 912. Accordingly, even if the control signal S1 is set to a low level to stop the operation of the differential stage, the current controlled by a current source 915 tends to flow into the differential stage. Thus, when the leakage current of the low-VT TFT switch 951 is large, the power dissipation when the differential stage is inactive increases. In this way, there is a problem that a low-VT TFT, if applied to a switch, would increase power dissipation even in an analog circuit. By contrast, according to the present invention, a low-VT TFT is applied to a circuit part where a predetermined internal current of an analog circuit flows but not to a switch. In addition, a current path route that includes low-VT TFTs also includes a switch configured by a high-VT TFT to prevent power dissipation from being increased.

Figure 17:
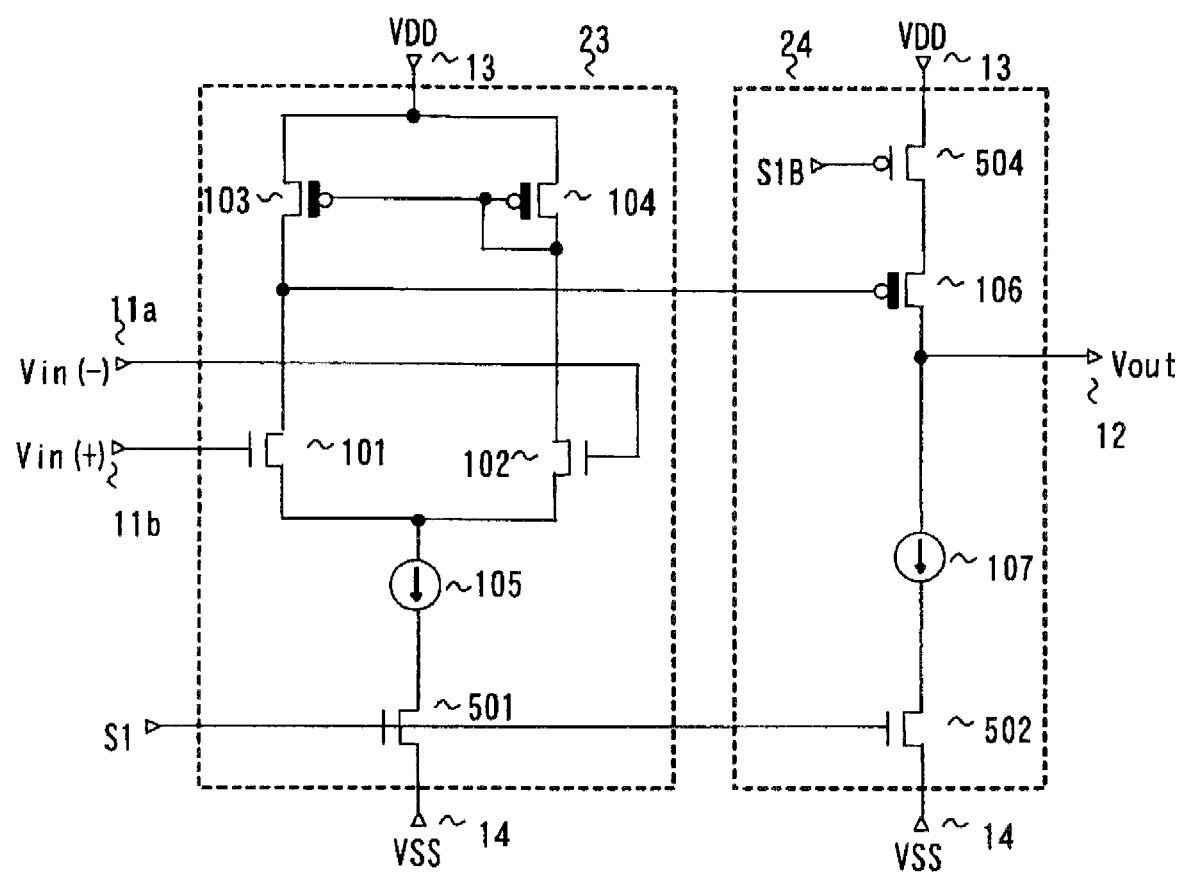
FIG. 17 is a circuit diagram showing a configuration of a differential amplifier circuit according to a sixth embodiment of the present invention.

Referring to FIG. 17, an analog circuit, according to a sixth embodiment of the present invention, which includes two kinds of TFTs, will be described in the below. In FIG. 17, a circuit configuration of a differential amplifier according to the sixth embodiment of the present invention.

As shown in FIG. 17, in the differential amplifier circuit according to the present embodiment, a differential stage 23 includes low-VT TFTs and an amplification stage 24 includes a low-VT TFT. More specifically, in the differential stage 23, a pair of transistors 101 and 102 constituting a differential pair, a switch transistor inserted between a current source 501 and a power supply VSS are high-VT TFTs, while a pair of transistors 103 and 104 constituting a current mirror circuit functioning as an active load pair of the differential pair are low-VT TFTs. A p-channel transistor 106 in the amplification stage 24 is a low-VT TFT, while a transistor 504 connected between a source of the p-channel transistor 106 and a high potential power supply terminal 13 is a high-VT TFT and a n-channel transistor 502 connected in series with a current source 107 between an output terminal 12 and a low potential power supply terminal 14 is a high-VT TFT. Meanwhile, the current sources 105 and 107 are respectively connected in series with transistors 501 and 502, and hence if each of current sources 105 and 107 may be made up of a transistor, which is either a low-VT TFT or a high-VT TFT. A control signal S1 is supplied to gates of the transistors 501 and 502 each functioning as a switch element, while the inverted signal S1B of the control signal S1 is supplied to the gate of the transistor 504. In case of the differential amplifier being activated, the transistors 501, 502 and 504 are set to be in an on state and in case of the differential amplifier being stopped (deactivated), the transistors 501, 502 and 504 are set to be in an off state.

The outline of the operation of the circuit shown in FIG. 17 will be described. When the control signal S1 is at a high level and both the differential stage 23 and the amplification stage (output amplification stage) 24 are in an activated state, with a change in a signal voltage Vin(+) at the non-inverting input terminal 11b to a value which is higher than a signal voltage Vin(−) of the inverting input terminal 11a, the gate-to-source voltage of the n-channel transistor 101 is increased to cause a channel current (drain current) to increase. Hence, the output node voltage of the differential stage 23 is lowered because of a voltage drop through an on-state-resistor of the transistor 103 and the gate-to-source voltage of the p-channel transistor 106 becomes more increased to increase a channel current (drain or source current) of the p-channel transistor 106, as a result of which the current, obtained on subtracting the channel current(drain or source current) of the p-channel transistor 106 by the sink current of the current source 105, becomes positive to raise the output terminal voltage Vout in phase with the signal voltage Vin(+) at the non-inverting input terminal 11b. For example, in case of a capacitive load, the amount to the electric charge accumulated in a load capacitor attached to the output terminal 12 increases. With a change in a signal voltage Vin(+) at the non-inverting input terminal 11b to a value which is lower than a signal voltage Vin(−) of the inverting input terminal 11a, the gate-to-source voltage of the n-channel transistor 101 is decreased to cause a channel current to decrease. Hence, the output node voltage of the differential stage 23 is raised because of a voltage drop in an on-state-resistor of the transistor 103 and the gate-to-source voltage of the p-channel transistor 106 becomes more decreased to decrease a channel current (drain or source current) of the p-channel transistor 106, as a result of which the current, obtained on subtracting the drain current Ids of the p-channel transistor 106 by the sink current of the current source 105, becomes negative(minus) to lower the output terminal voltage Vout in phase with the signal voltage Vin(+) at the non-inverting input terminal 11b. If the p-channel transistor 106 becomes cut-off, the electric charge in the output terminal 12 is discharged and the output terminal voltage Vout becomes the power supply voltage VSS.

In the present embodiment, the differential pair transistors 101 and 102 are both high-VT TFT in place of low-VT TFT in FIG. 10. The operation range of the differential stage 23 is not expanded. However, since a pair transistors 103 and 104 composing a current mirror are both low-VT TFTs and a transistor 106 in the output amplification stage is a low-VT TFT, the operation speed of the differential amplifier circuit is improved. Though in FIG. 17, a single stage type current mirror circuit made up of a pair of transistors 103 and 104 is shown, the same effect may also be achieved by a configuration in which the single stage current mirror circuit constituting an active load is replaced by a cascode type current mirror circuit including plural stages of transistors, a part or all of which are low-VT TFT.

In FIGS. 8-10, and FIG. 17, the embodiments are described which are designed to enhance a performance of the differential amplifier circuit by using low-VT TFT. More detailed description regarding the position(element) at which a low-VT TFT is applied and an effect to the performance of the differential amplifier circuit, will be done in the below.

As described in the above embodiments, in case where the differential pair of the differential amplifier circuit are made up of low-VT TFTs, while transistors other than the differential pair are made up of high-VT TFTs, the input/output voltage range can be enlarged. If transistors composing the current mirror circuit and/or the output amplification circuit are low-VT TFTs, the operation speed can be raised.

However, there is a case where the operation speed of the differential amplifier circuit may be reduced, if the differential pair of the differential amplifier circuit is made up of low-VT TFTs. More specifically, in case where the threshold voltage of low-VT TFTs composing a differential pair is sufficiently small as compared with that of a high-VT TFT, the operation speed of the differential amplifier circuit is reduced for the input voltage close to the high potential power supply voltage VDD.

Referring to FIG. 8, when the input voltage Vin(+) at the differential pair (made up of transistors 101 and 102) is close to the high potential power supply voltage VDD, the voltage at the commonly coupled source of transistors 101 and 102 is raised. The maximum swing at the output voltage of the differential pair (drain voltage of the transistor 101) is in the voltage range between the power supply voltage VDD and the voltage at the commonly coupled source of transistors 101 and 102. Accordingly, if the threshold voltage of the transistors 101 and 102 is sufficiently small, the swing range of the output voltage of the differential stage 23 is made small and the amplification effect by the transistor 106 is diminished, as a result of which the operation speed of the differential amplifier circuit is reduced. However, if an upper limit of the input/output voltage range of differential amplifier circuit is sufficiently low as compared with the high-potential power supply voltage VDD, there is no problem. Accordingly, if the low-VT TFTs are to be employed in the differential pair in order to enlarge the input/output voltage range, the threshold voltage of a low-VT TFT must be set by taking into considerations the upper limit of the input/output voltage range and the operation speed of the differential amplifier circuit.

The differential amplifier circuit shown in FIG. 10 can enlarge the input/output voltage range and improves the operation speed as compare with the differential amplifier circuit shown in FIG. 8.

The differential amplifier circuit shown in FIG. 17 does not enlarge the input/output voltage range. However, it achieves the best improvement of the operation speed.

As described in the above, by selecting appropriately a placement or element to which a low-VT TFT is employed, the performance of the differential amplifier circuit is improved.

Figure 18:
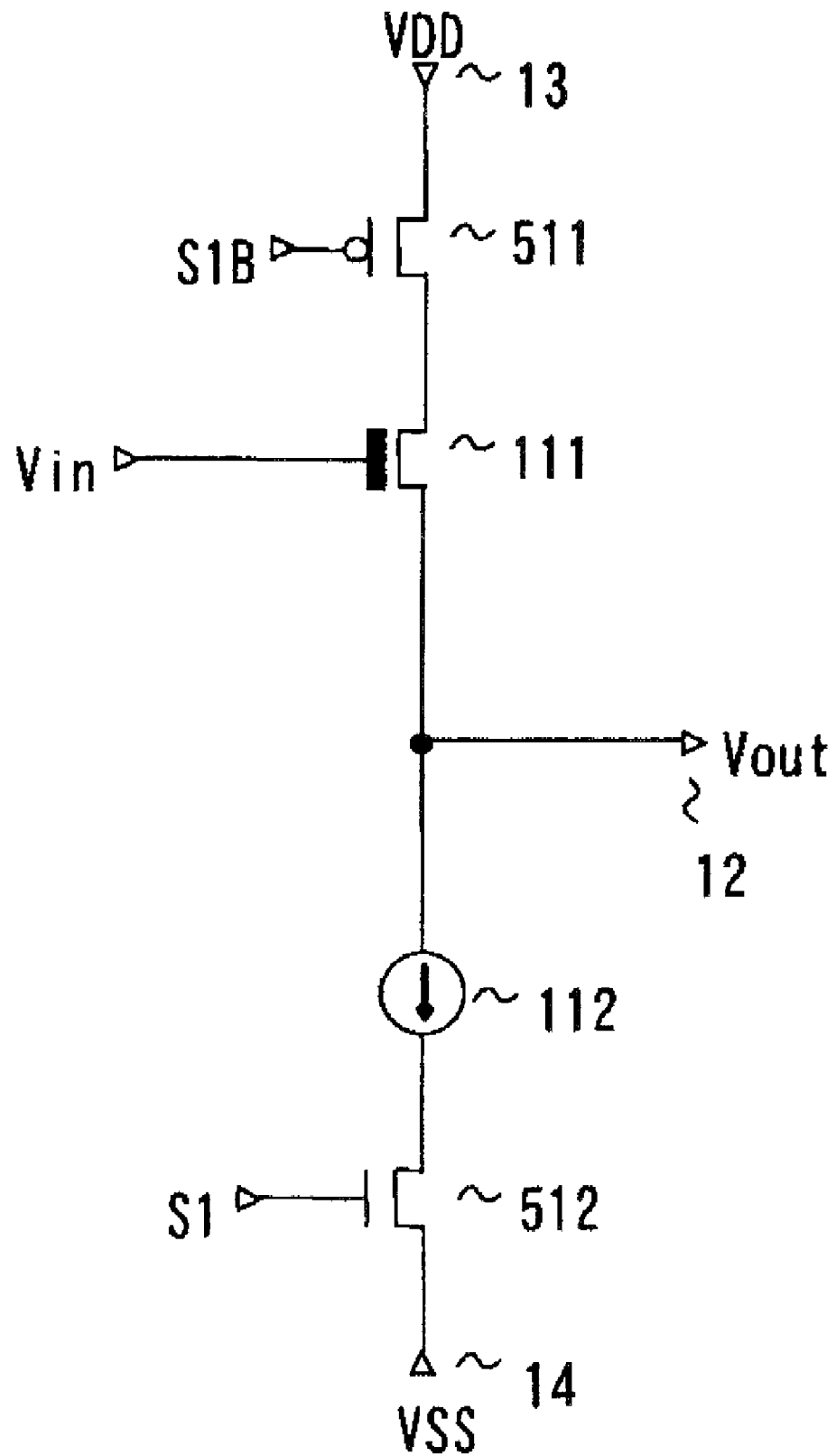
FIG. 18 is a circuit diagram showing a configuration of a source follower amplifier circuit according to a seventh embodiment of the present invention.

Next, a circuit configuration, to which a combination of a low-VT TFT and a high-VT TFT according to the present invention is applied, other than a differential amplifier circuit, will be described. FIG. 18 illustrates an example of a circuit configuration of a source follower circuit according to a seventh embodiment of the present invention. Referring to FIG. 18, the source follower circuit according the present embodiment, includes a n-channel transistor 111 and p-channel switch transistor 511 connected in series between a high-potential power supply terminal 13 and an output terminal 12 and a current source 112 and n-channel switch transistor 512 connected in series between the output terminal 112 and a lower potential side terminal 14. An input signal voltage Vin is supplied to a gate of the n-channel transistor 111. A control signal S1 and a signal S1B which is an inverted signal of the control signal S1 are supplied to gates of the n-channel switch transistor 512 and the p-channel transistor 511 respectively. In case of the control signals S1 and the inverted signal S1B being high and at low respectively, the source follower circuit is activated. In case of the control signals S1 and the inverted signal S1B being low and high respectively, the source follower circuit is deactivated.

Referring to FIG. 18, the operation of the source follower circuit will be described in the below.

If the input voltage Vin is increased, the output voltage Vout is pulled up by the source-follower operation of the n-channel transistor 111 and the output voltage Vout is stabilized at the voltage which is the shifted from input voltage Vin by a gate-to-source voltage of the n-channel transistor 111.

If the input voltage Vin is lowered, the n-channel transistor is at once caused to be cut off and the output voltage Vout is pulled down by a discharging operation of the current source 112. When the potential difference between the input voltage Vin and the output voltage Vout exceeds its threshold voltage, the n-channel transistor 111 is in an on state again and the output voltage Vout is made stabilized at the voltage which is shifted from the input voltage Vin by a gate-to-source voltage of the n-channel transistor 111.

In the amplifier circuit shown in FIG. 18, in which the transistor 111 is a low-VT TFT and other transistors are high-VT TFT, the dynamic range of the amplifier circuit is extended and the speed of the source follower operation is improved. The power dissipation of the amplifier circuit does not increase because the switch transistor 511 and 512 are both high-VT TFT.

Next, the eight embodiment of the present invention will be described. In the embodiments described by referring to FIGS. 8 to 11, and FIGS. 17 and 18, in which a low-VT TFT is employed, an extra transistor for serving as a dedicated switch is provided for cutting off current path from a high-potential power supply 13 to a low-potential power supply 14. The present embodiment adopts a configuration in which an existing high-VT TFT is utilized as the switch function.

Figure 19:
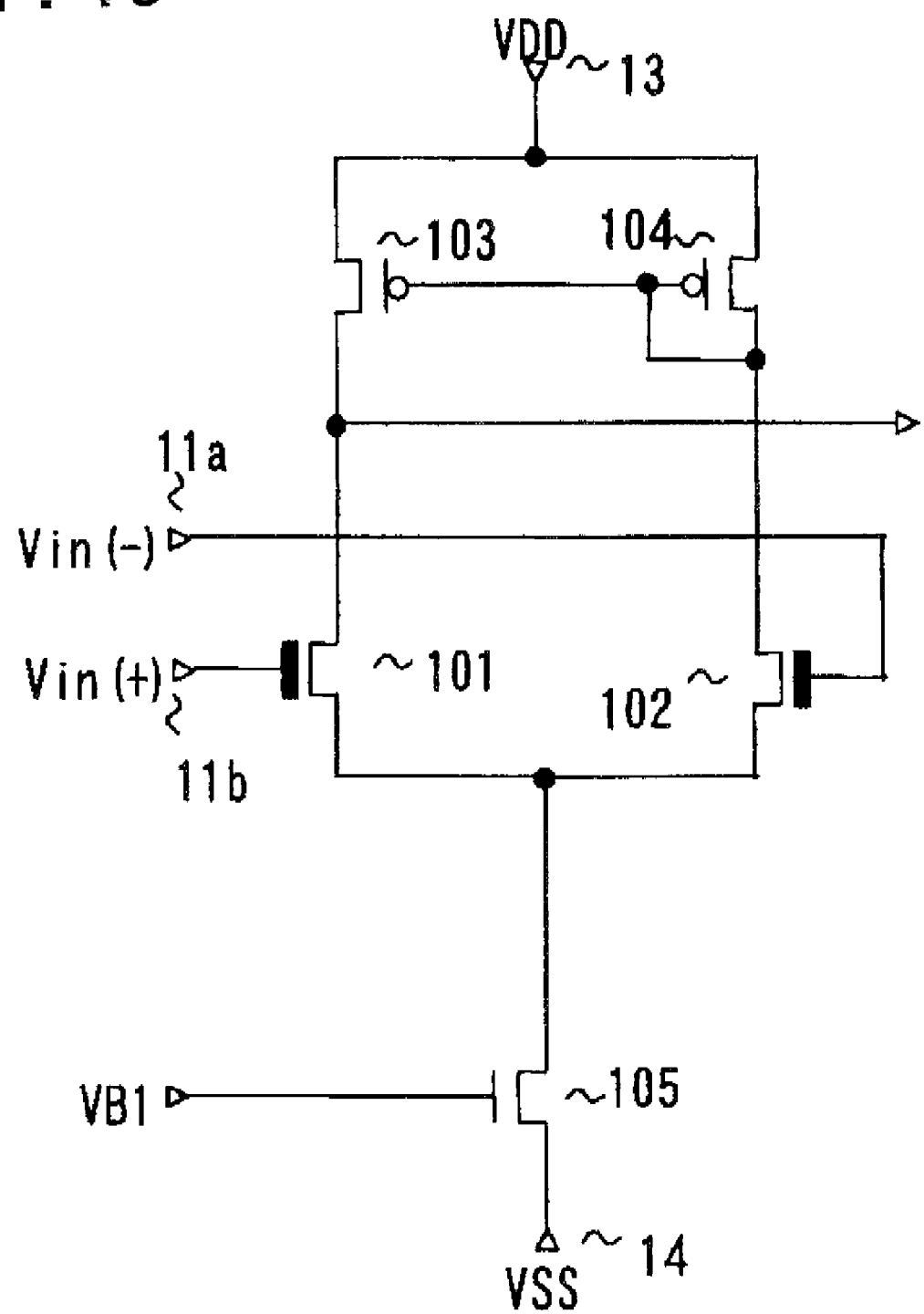
FIG. 19 is a circuit diagram showing a configuration of a differential stage according to an eighth embodiment of the present invention.

FIG. 19 shows the circuit configuration in which the transistor constituting a current source 105 of the differential stage 23 shown in FIG. 8 is equipped with the same function as the switch transistor 501 of FIG. 8, and the switch transistor 501 of FIG. 8 is removed.

FIG. 19 illustrates only a typical example of the differential stage 23, while the amplifier stage 24 is omitted and not shown. The current source 105 is made up of a high-VT TFT, to the gate of which a bias voltage VB1 is supplied. If the bias voltage VB1 is set to a predetermined voltage, the differential amplifier circuit is activated, while the differential amplifier circuit is deactivated, if the bias voltage VB1 is set to a power supply voltage VSS. In case of the differential amplifier circuit being deactivated, the current source made up of a high-VT TFT is in an off state and hence the increase of the power dissipation due to the leakage current is suppressed. The present embodiment in which the current source is caused to be equipped with a switch function can perform the same effect as the differential stage 23 shown in FIG. 8.

Figure 20:
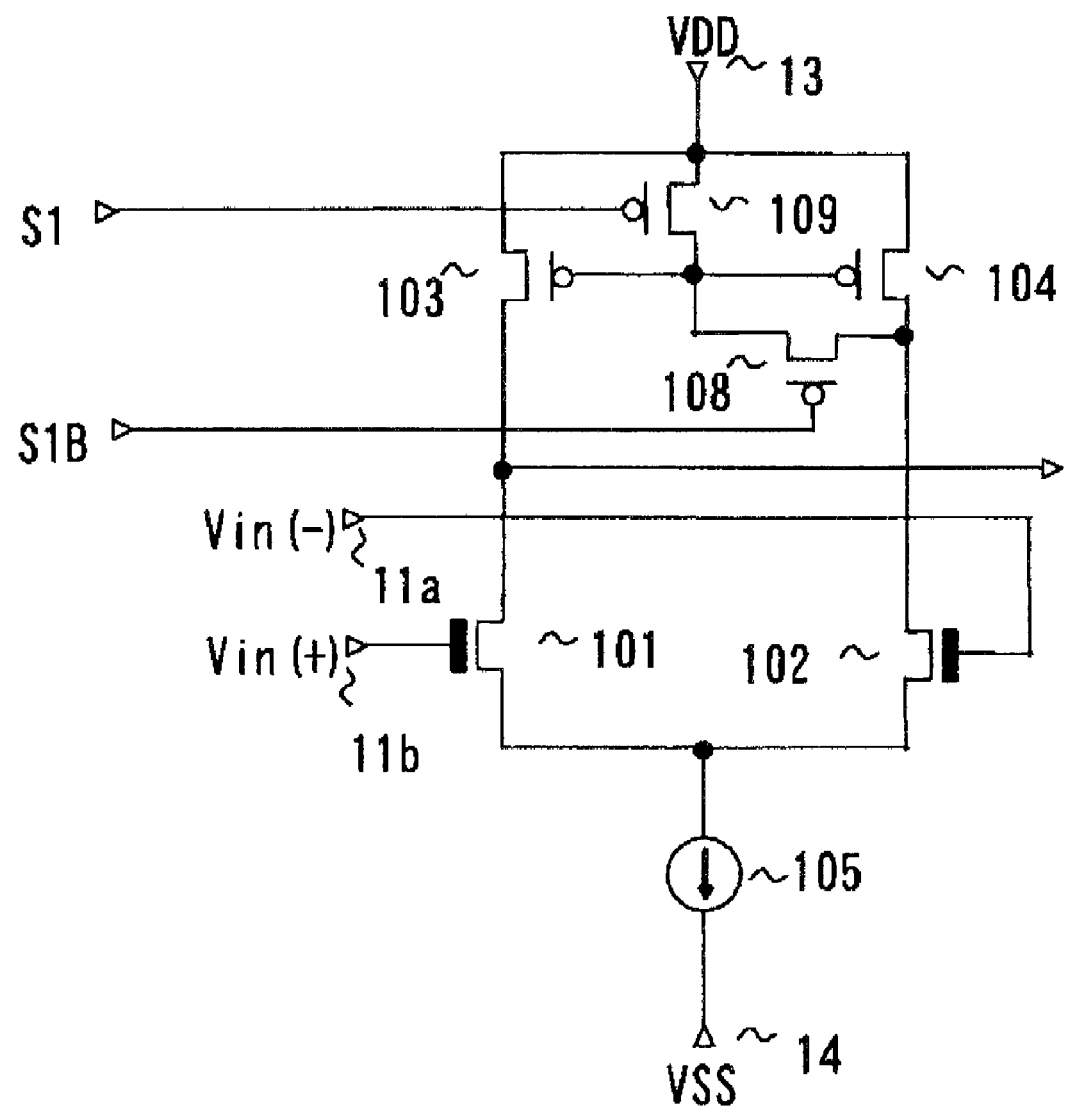
FIG. 20 is a circuit diagram showing a configuration of a differential stage according to a ninth embodiment of the present invention.

FIG. 20 shows another embodiment of the present invention, which is a modification of the configuration shown in FIG. 19. Referring to FIG. 20, in the present embodiment, there is added a switch function in the transistors 103 and 104 constituting a current mirror circuit functioning as an active load of the differential pair. In the circuit configuration according to the present embodiment, as shown in FIG. 20, the switch transistor 501 is removed from the differential stage 23 shown in FIG. 8 and p-channel transistors 108 and 109, each of which is a high-VT TFT, are added. The p-channel transistors 108, which is connected between the commonly coupled gates of transistors 103 and 104 constituting the current mirror and a drain of the transistor 104, has a gate supplied with a control signal S1B which is an inverted signal of a control signal S1. The p-channel transistors 109, which is connected between the commonly coupled gates of transistors 103 and 104 and a high-potential power supply terminal 13, has a gate supplied with a control signal S1. In case of the control signals S1 and S1B being high and low, the transistors 108 and 109 are turned on and off respectively and hence the transistors 103 and 104 function as a current mirror circuit. In case of the control signals S1 and S1B being low and high, the transistors 108 and 109 are turned off and on respectively and hence the voltage of the coupled gate of the transistors 103 and 104 is set to a high-potential power supply voltage VDD to turn off the transistors 103 and 104. The transistor 108 is turned off to make a path between a drain and gate of the transistor 104 non-conductive.

The differential amplifier circuit according to the present embodiment, in case of deactivated, can cut off the idling current and suppress the increase of the power dissipation for the leakage current because transistors 103, 104 and 108 each made up of a high-VT TFT, are turned off. The present embodiment in which a switch function is added to the current mirror circuit composed by transistors 103 and 104, can perform the same effect as the differential stage 23 of the embodiment shown in FIG. 8.

As described above, the switch made up of a high-VT TFT for cutting off the idling current is not necessarily a dedicated switch for cutting off current and any optional configuration which has both the switch function and other function combined together may be employed.

As a modification example, the p-channel transistor 106 of the amplification stage shown for example in FIG. 8, may be replaced by a source follower type transistor (n-channel transistor). In this modification example, a switch transistor 503 has a source connected to the low-potential power supply terminal 14, a drain connected to a gate of the source follower type transistor and a gate connected to a control signal S1B which is an inverted signal of the control signal S1. It is needless to say that the amplification stage 24 shown for example in FIG. 10 may be constituted by of a source follower configuration which is shown in FIG. 18. If the transistor of the amplification stage is constituted as a follower type configuration, an inverting input signal Vin(−) and a non-inverting input signal Vin(+) are reversed as compared with those shown in FIG. 10, that is, the input terminals 11*a* and 11*b* function as the non-inverting input terminal for receiving a signal voltage Vin(+) and the inverting input terminal for receiving a signal voltage Vin(−) respectively.

In the above described embodiments, in 5V-power supply system, the threshold voltage of the high VT TFT is for example, about +/−1.0 to +/−1.2V, the threshold voltage of the low-VT TFT is for example, about, +/−0.0 to +/−0.2V. Th sign "+" denotes a threshold voltage of the n-channel type TFT, and the sign "−" denotes a threshold voltage of the p-channel type TFT (the gate-to-source voltage at which the p-channel type TFT is turned on). In case of a threshold value of the p-channel type TFT, high and low of said threshold value corresponds to large and small of an absolute value of a threshold value. A threshold value 0.2V(an absolute vale of −0.2V) is lower than a threshold value 1.2V(an absolute vale of −1.2V).

The present invention, which is not limited to the configuration of the above described embodiments, includes any modification and correction that can be achieved by those skilled in the art within the scope of the present invention.

For example, although in the above described embodiments, polycrystalline silicon TFTs are employed, a channel region of the transistor according to the present invention is not limited to a polycrystalline silicon thin film. For example, the present invention includes such a configuration in which the channel region is located in one granule due to the extension of the granular size of a silicon crystal.

In the present invention, in stead of the formation of the polycrystalline film by laser crystallization, the crystallization by solid phase deposition may be used.

The effect by the present invention is not made possible only by the manufacturing method of the present invention. Though, in the above embodiments, the present invention is described in combination with the manufacturing method which can achieve the effect with lesser number of processes, a channel-doping process are divided into plural number of times and TFTs which are the same channel type and have different VTs can be formed. In this method, the number of processes increases and hence the manufacturing cost increases. However, in case where the importance is attached to the circuit performance more than to the manufacturing cost, the circuit performance can be improved by adopting a circuit configuration of embodiments of the present invention as shown for example in FIGS. 7 to 11, and FIGS. 17 to 20. This applies in similar way to a circuit formed by any other manufacturing method.

However, by employing the manufacturing method described in the above-described embodiments, the increase in the manufacturing cost is suppressed and the enhancement of the circuit performance is achieved.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A thin film semiconductor device comprising:
   an insulating substrate; and
   a thin film transistor, termed herein TFT, of a first conductive type and a second conductive type TFT formed on said insulating substrate each having a polycrystalline silicon film as an active layer;
   wherein said device comprises:
   a first TFT of the first conductive type including a first dopant in channel regions;
   a second TFT of the first conductive type not including said first dopant in channel regions; and
   a third TFT of the second conductive type including said first dopant in channel regions at approximately an equal dose to said first dopant.

2. The thin film semiconductor device according to claim 1, wherein said first and second TFTs of the first conductive type respectively include a second dopant in the respective channel regions.

3. The thin film semiconductor device according to claim 1, wherein said device further comprises a fourth TFT of the second conductive type which does not include said first dopant in channel regions.

4. The thin film semiconductor device according to claim 3, wherein one of said first and second TFTs of the first conductive type has a high threshold voltage in absolute value, while the other thereof has a low threshold voltage in absolute value; and
   one of said third and fourth TFTs of the second conductive type has a high threshold value in absolute value, while the other thereof has a low threshold voltage in absolute value.

5. The thin film semiconductor device according to claim 4, comprising at least an analog circuit unit requiring an idling current at circuit operation time and a switch,
   wherein said analog circuit unit includes a TFT with said low threshold voltage in absolute value, which is included in said first to fourth TFTs with different threshold voltages, on a current path of an idling current; and
   wherein said switch is comprised of a TFT with a high threshold voltage in absolute value which is included in said first to fourth TFTs with different threshold voltages.

6. The thin film semiconductor device according to claim 5, wherein said analog circuit unit includes said switch on the current path of the idling current and said switch cuts off the idling current.

7. The thin film semiconductor device according to claim 6, wherein an activation and deactivation of said analog circuit unit is controlled by conduction and cutoff of the idling current via said switch.

8. The thin film semiconductor device according to claim 5, wherein,
   when said thin film transistor with the low threshold voltage in absolute value is included in a current path route of the idling current among an input terminal, an output terminal, and power supply terminals, said analog circuit unit includes said switch in said current path route.

9. The thin film semiconductor device according to claim 5, wherein said thin film transistor with a high threshold voltage in absolute value and said thin film transistor with a low threshold voltage in absolute value are both of enhancement type.

10. The thin film semiconductor device according to claim 5, wherein
    said analog circuit part includes one of an amplifier circuit, a power supply circuit, and a comparator.

11. The thin film semiconductor device according to claim 5,
    wherein said analog circuit unit is a differential amplifier circuit that at least includes said thin film transistor with the low threshold voltage in absolute value in a differential pair and includes said switch in a current path route of said differential pair.

12. A thin film semiconductor device comprising:
    an insulating substrate; and
    a thin film transistor, termed herein TFT, of a first conductive type and a second conductive type TFT, each having a crystalline silicon film as an active layer formed on the insulating substrate;
    wherein said device comprises:
    a first TFT of the first conductive type including a first dopant in channel regions;
    a second TFT of the first conductive type not including said first dopant in channel regions; and
    a third TFT of the second conductive type including said first dopant in channel regions at approximately an equal dose to said first dopant.

13. The thin film semiconductor device according to claim 12,
    wherein said device further comprises a fourth TFT of the second conductive type not including the first dopant in channel regions.

14. The thin film semiconductor device according to claim 13,
    wherein one of said first and second TFTs of the first conductive type has a high threshold voltage in absolute value, while the other thereof has a low threshold voltage in absolute value; and
    one of said third and fourth TFTs of the second conductive type has a high threshold voltage in absolute value, while the other thereof has a low threshold voltage in absolute value.

15. The thin film semiconductor device according to claim 14,
    wherein said device comprises a fifth TFT having a threshold voltage which is different from that of the first through fourth TFTs.

16. The thin film semiconductor device according to claim 14,
    wherein a circuit is formulated by connecting in series on a current path, a TFT having the low threshold voltage in absolute value among the first through fourth TFTs, and a TFT having the high threshold voltage in absolute value among the first to through fourth TFTs, across power terminals, or across a power terminal and an input/output terminal; and wherein said circuit is activated or deactivated when said TFT having the high threshold voltage in absolute value is turned ON or OFF, respectively, provided that said TFT having the high threshold voltage in absolute value is ON/OFF controlled by a control signal applied to a control terminal of this TFT.

* * * * *